United States Patent
Lee et al.

(10) Patent No.: US 8,665,647 B2
(45) Date of Patent: Mar. 4, 2014

(54) NONVOLATILE MEMORY DEVICE, MEMORY SYSTEM, AND READ METHOD THEREOF

(75) Inventors: Ju Seok Lee, Jeongeup-si (KR); Jae Yong Jeong, Yongin-si (KR); Seung Bum Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 266 days.

(21) Appl. No.: 13/302,573

(22) Filed: Nov. 22, 2011

(65) Prior Publication Data
US 2012/0134208 A1    May 31, 2012

(30) Foreign Application Priority Data
Nov. 26, 2010  (KR) ........................ 10-2010-0118953

(51) Int. Cl.
*G11C 11/34* (2006.01)

(52) U.S. Cl.
USPC ............ 365/185.18; 365/185.05; 365/185.17; 365/185.24

(58) Field of Classification Search
USPC ............. 365/185.02, 185.03, 185.24, 185.25, 365/185.17, 185.08, 185.18
See application file for complete search history.

(56) References Cited

U.S. PATENT DOCUMENTS

| 7,196,946 B2 | 3/2007 | Chen et al. |
| 7,440,324 B2 | 10/2008 | Mokhlesi |
| 2008/0084755 A1* | 4/2008 | Mokhlesi .................. 365/185.21 |
| 2008/0285341 A1* | 11/2008 | Moschiano et al. ...... 365/185.02 |
| 2009/0141552 A1* | 6/2009 | Sukegawa ................ 365/185.03 |
| 2010/0074026 A1 | 3/2010 | Kang |

FOREIGN PATENT DOCUMENTS

| JP | 2008536252 | 9/2008 |
| JP | 2010515202 | 5/2010 |
| KR | 1020080016545 A | 2/2008 |
| KR | 1020090117709 A | 12/2009 |
| KR | 1020100033192 A | 3/2010 |
| WO | 2006107730 A1 | 10/2006 |
| WO | 2008083137 A1 | 7/2008 |

* cited by examiner

*Primary Examiner* — Alexander Sofocleous
*Assistant Examiner* — Hien Nguyen
(74) *Attorney, Agent, or Firm* — Volentine & Whitt, PLLC

(57) ABSTRACT

A non-volatile memory device performs a read operation for compensating for coupling due to an adjacent memory cell. With the read operation of the non-volatile memory device, the coupling effect included in a read result of the selected memory cell is compensated on the basis of a program state of an adjacent memory cell adjacent to the selected memory cell. Toward this end, a read operation for the adjacent memory cell is selectively performed before the selected memory cell is read. Upon sensing of data from the selected memory cell, one or more read operations for the selected memory cell are performed according to the program state of the adjacent memory cell with a read voltage being changed in level depending on the program state of the adjacent memory cell.

20 Claims, 21 Drawing Sheets

Fig. 10

| Operation | DL0 | DL1 | DL2 | DL3 | DL4 |
|---|---|---|---|---|---|
| P0 Read | WL1 Data (LSB Page) | WL1 Data (MSB Page) | | P2 Data | P0 Data |
| P1 Read | WL2 Data (LSB Page) | WL2 Data (MSB Page) | P4 Data | P2 Data | P1 Data |
| P2 Read | WL2 Data (LSB Page) | WL2 Data (MSB Page) | P4 Data | | P2 Data |
| P3 Read | WL3 Data (LSB Page) | WL3 Data (MSB Page) | P6 Data | P4 Data | P3 Data |
| ... | ... | ... | ... | ... | ... |

WL and Page Configuration

| WL# | LSB Page | MSB Page |
|---|---|---|
| ... | ... | ... |
| WL3 | P5 | P8 |
| WL2 | P3 | P6 |
| WL1 | P1 | P4 |
| WL0 | P0 | P2 |

Fig. 11

| Operation | DL0 | DL1 | DL2 | DL3 |
|---|---|---|---|---|
| P0 Read | WL1 Data (P1,P3 state) | | | P0 Data |
| P1 Read | WL2 Data (P1,P3 state) | P4 Data | P2 Data | P1 Data |
| P2 Read | WL2 Data (P1,P3 state) | P4 Data | | P2 Data |
| P3 Read | WL3 Data (P1,P3 state) | P6 Data | P4 Data | P3 Data |
| ... | ... | ... | ... | ... |

WL and Page Configuration

| WL# | LSB Page | MSB Page |
|---|---|---|
| ... | ... | ... |
| WL3 | P5 | P8 |
| WL2 | P3 | P6 |
| WL1 | P1 | P4 |
| WL0 | P0 | P2 |

Fig. 13

| Operation | DL0 | DL1 | DL2 | DL3 | DL4 |
|---|---|---|---|---|---|
| P0 Read | | | | | P0 Data |
| P1 Read | WL2 Data (LSB Page) | WL2 Data (MSB Page) | WL1 Data (LSB Page) | WL1 Data (MSB Page) | P1 Data |
| P2 Read | WL2 Data (LSB Page) | WL2 Data (MSB Page) | WL1 Data (LSB Page) | WL1 Data (MSB Page) | P2 Data |
| P3 Read | WL2 Data (LSB Page) | WL2 Data (MSB Page) | WL1 Data (LSB Page) | WL1 Data (MSB Page) | P3 Data |
| ... | ... | ... | ... | ... | ... |

WL and Page Configuration

| WL# | LSB Page | MSB Page |
|---|---|---|
| ... | ... | ... |
| WL3 | P5 | P8 |
| WL2 | P3 | P6 |
| WL1 | P1 | P4 |
| WL0 | P0 | P2 |

NONVOLATILE MEMORY DEVICE, MEMORY SYSTEM, AND READ METHOD THEREOF

CROSS-REFERENCE TO RELATED APPLICATIONS

This application claims the benefits, under 35 U.S.C. §119, of Korean Patent Application No. 10-2010-0118953 filed Nov. 26, 2010, the entirety of which is incorporated by reference herein.

BACKGROUND

1. Field

Exemplary embodiments relate to a semiconductor memory device, and more particularly, relate to a non-volatile memory device, a memory system, and a read method thereof.

2. Description of the Related Art

Semiconductor memory devices may be generally classified into volatile memory devices and non-volatile memory devices. Volatile memory devices may lose stored contents when a supply of power is removed therefrom, while non-volatile memory devices may retain stored contents even when a supply of power is removed therefrom. Non-volatile memory devices may be formed of various types of memory cell transistors. Non-volatile memory devices may include flash memory device, ferroelectric random access memory (FRAM) devices, magnetic RAMs (MRAMs), phase change RAMs (PRAMs), or the like.

As one type of non-volatile memory device, flash memory devices, may be divided into NOR type flash memory devices and NAND flash memory devices according to connection relationships of memory cells and bit lines. NOR flash memory devices may have a structure wherein two or more memory cell transistors are connected to one bit line in parallel. Accordingly, NOR flash memory devices may have an excellent random access time characteristic. On the other hand, NAND flash memory devices may have a structure wherein two or more memory cells are connected to one bit line in series. This structure is called a cell string structure. One cell string may require one bit line contact. Accordingly, NAND flash memory devices may have an excellent device integration characteristic.

Memory cells of a flash memory device may be determined to be ON cells or OFF cells according to a threshold voltage distribution. An ON cell may represent an erased cell, and an OFF cell may represent a programmed cell. A programmed memory cell may have one threshold voltage belonging to one of a plurality of threshold voltage distributions each corresponding to N program states (or, programmed data values) (N being an integer of 1 or more).

At programming, a coupling effect may occur between selected memory cell and adjacent memory cell. The coupling effect may make a threshold voltage distribution corresponding to the selected memory cell become wide and a margin between adjacent threshold voltage distributions become narrow. Such a coupling effect may be called "electric field coupling" or "F-poly coupling". If a variation of the threshold voltage distribution corresponding to the selected memory cell and a reduction of the margin between adjacent threshold voltage distributions are caused due to the coupling effect, it is impossible to reliably read data from memory cells. This problem may increase in proportion to an increase in the number of data bits being stored per cell.

SUMMARY

One object of embodiments of the inventive concept is directed to improving the reliability of data by compensating for the coupling effect between memory cells.

Another object of embodiments of the inventive concept is directed to improving speed up an operating speed.

One aspect of embodiments of the inventive concept is directed to providing a method of reading data from a selected memory cell of a non-volatile memory device. The method comprises sensing data stored in an adjacent memory cell which is adjacent to the selected memory cell; temporarily storing the sensed data of the adjacent memory cell; sensing data stored in the selected memory cell at least once, wherein the sensing is based on the temporarily stored data of the adjacent memory cell; and temporarily storing the sensed data of the selected memory cell, wherein the stored data of the adjacent memory cell is temporarily stored up to a point of time of when sensing a second adjacent memory cell which is adjacent to a second selected memory cell from which data is to be read.

In one or more embodiments, the selected memory cell stores at least two bits of data each accessed according to a page address, and wherein the sensing data stored in the selected memory cell includes sensing first one of the bits of data of the selected memory cell.

In one or more embodiments, the method further comprises sensing a second one of the bits of data of the selected memory cell based on the sensed data of the adjacent memory cell; and temporarily storing the sensed second bit of data of the selected memory cell.

In one or more embodiments, the method further comprises outputting the sensed first bit of data of the selected memory cell, wherein sensing the second bit of data of the selected memory cell and temporarily storing the sensed second data of the selected memory cell are performed before outputting the sensed first data of the selected memory cell.

In one or more embodiments, the stored second data of the selected memory cell is maintained until a read operation on the second data is requested.

In one or more embodiments, sensing the data stored in the selected memory cell comprises applying a read voltage to a selected word line at least once.

In one or more embodiments, the read voltage has a first voltage level that is determined according to a first threshold voltage distribution of the selected memory cell when the selected memory cell does not experience coupling of voltage due to the adjacent memory cell; and a second voltage level that is determined according to a second threshold voltage distribution of the selected memory cell when the selected memory cell experiences the coupling of voltage due to the adjacent memory cell.

In one or more embodiments, the first voltage level is less than the second voltage.

In one or more embodiments, sensing the data stored in the adjacent memory cell comprises determining whether a program state of the adjacent memory cell is a program state which imposes a coupling effect upon the selected memory cell.

In one or more embodiments, temporarily storing the sensed data of the adjacent memory cell comprises storing information indicating whether a program state of the adjacent memory cell is a program state which imposes the coupling effect upon the selected memory cell.

In one or more embodiments, a reading operation is performed for the non-volatile memory device in a sequential manner corresponding to a sequential increase of a page address.

Another aspect of embodiments of the inventive concept is directed to providing a non-volatile memory device. The non-volatile memory device comprises a memory cell array including a selected memory cell connected with a selected word line and an adjacent memory cell connected to a word line adjacent to the selected word line; a data input/output circuit configured to read data of the selected memory cell and the adjacent memory cell and to temporarily store the read data of the selected memory cell and the adjacent memory cell; and control logic configured to control the data input/output circuit to perform at least one read operation on the selected memory cell based on the data of the adjacent memory cell temporarily stored in the data input/output circuit, wherein the data input/output circuit retains the temporarily stored data of the adjacent memory cell until a read operation of a second selected memory cell is being executed to read the second selected memory cell.

In one or more embodiments, the selected memory cell stores at least two bits of data each accessed according to a page address, and wherein the control logic controls the data input/output circuit to read first data and second data of the selected memory cell based on the temporarily stored data of the adjacent memory cell and to temporarily store the read first data and second data.

In one or more embodiments, the data input/output circuit retains the second data until a read operation for the second data of the selected memory cell is requested.

In one or more embodiments, the non-volatile memory device further comprises a voltage generator configured to apply a read voltage to the selected word line and the adjacent word line.

In one or more embodiments, the voltage generator generates different read voltages for reading data stored in the selected memory cell once or several times, under a control of the control logic.

In one or more embodiments, each of the different read voltages has one of a first voltage level that is determined according to a first threshold voltage distribution of the selected memory cell when the selected memory cell does not experience coupling due to the adjacent memory cell; and a second voltage level that is determined according to a second threshold voltage distribution of the selected memory cell when the selected memory cell experiences the coupling due to the adjacent memory cell.

In one or more embodiments, the data input/output circuit temporarily stores data indicating whether a program state of the adjacent memory cell is a program state that imposes a coupling effect upon the selected memory cell.

In one or more embodiments, the memory cell array comprises a substrate and a plurality of cell strings provided on the substrate, wherein each of the plurality of cell strings includes a plurality of cell transistors stacked in a direction perpendicular to the substrate.

Still another aspect of embodiments of the inventive concept is directed to providing a memory system which comprises a non-volatile memory device; and a controller configured to control the non-volatile memory device according to a request of a host device. The non-volatile memory device comprises: a memory cell array including a selected memory cell and a memory cell adjacent to the selected memory cell, the selected memory cell storing at least two bits of data each accessed according to a page address; a data input/output circuit configured to read data of the selected memory cell and the adjacent memory cell and to temporarily store the read data of the selected memory cell and the adjacent memory cell; and control logic configured to control the data input/output circuit to perform one or more read operations on the selected memory cell based on the data of the adjacent memory cell temporarily stored in the data input/output circuit. The data input/output circuit retains the temporarily stored data of the adjacent memory cell until a read operation of another selected memory cell is being executed to read the other selected memory cell. The control logic controls the data input/output circuit to read first data and second data of the selected memory cell based on the temporarily stored data of the adjacent memory cell, and to temporarily store the read first and second data.

Still another aspect of embodiments of the inventive concept is directed to providing a method of reading data from a selected memory cell of a memory device having a plurality of memory cells. The method comprises: sensing data stored in an adjacent memory cell which is adjacent to the selected memory cell; selecting a voltage level for a first read voltage, including selecting a first voltage level when the sensed data of the adjacent memory cell has a first state, and selecting a second voltage level different from the first voltage level when the sensed data of the adjacent memory cell has a second state different from the first state; applying the first read voltage having the selected voltage level to the selected memory cell; and reading first data from the selected memory cell in response to the first read voltage having the selected voltage level.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 10 is a diagram for describing a read operation according to the second embodiment of the inventive concept.

FIG. 11 is a diagram for describing a read operation according to a third embodiment of the inventive concept.

FIG. 13 is a diagram for describing a read operation according to the fourth embodiment of the inventive concept.

DETAILED DESCRIPTION

Figure 1:
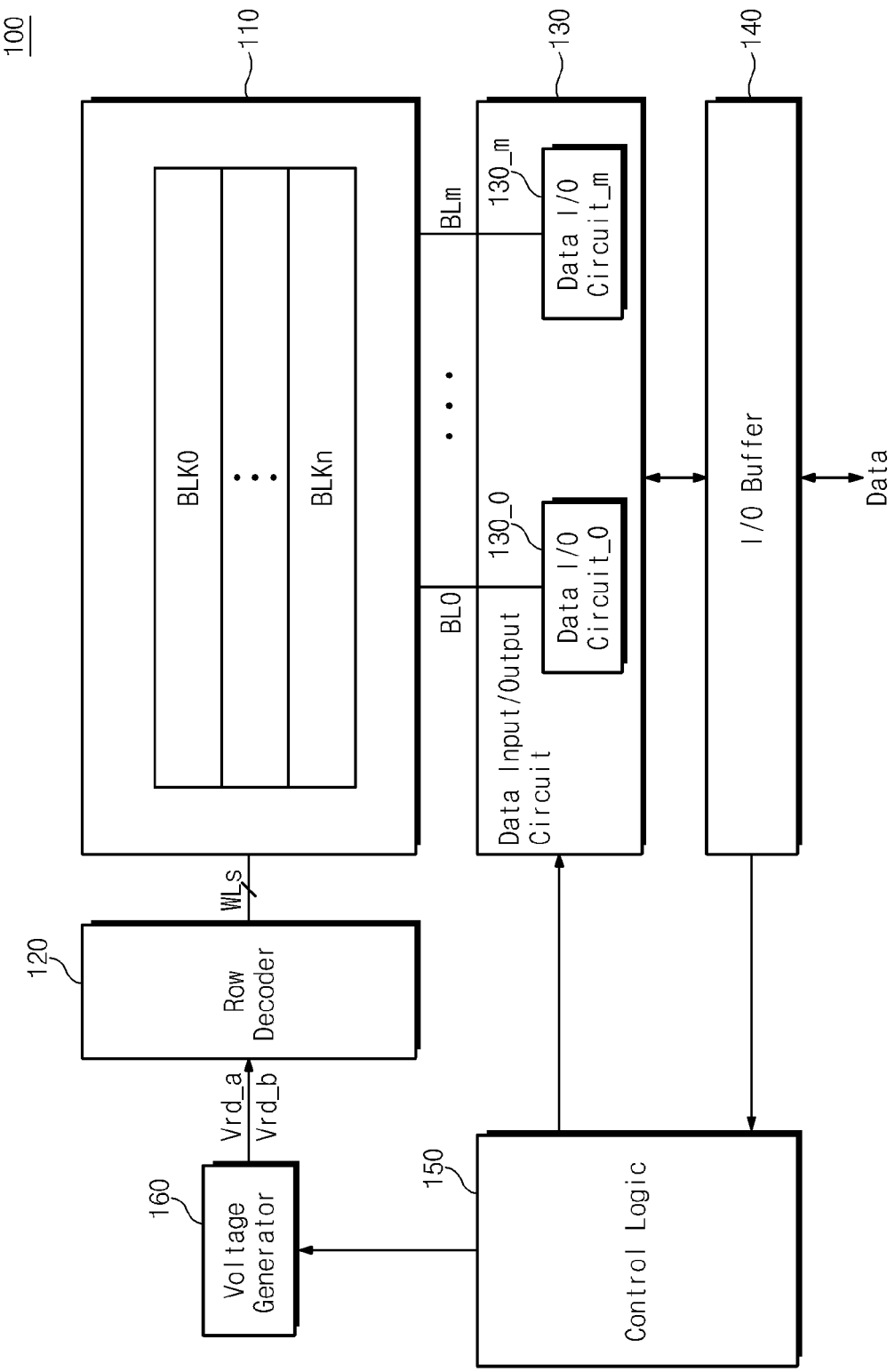
FIG. 1 is a block diagram of a non-volatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram of a non-volatile memory device 100 according to an exemplary embodiment of the inventive concept. Below, the inventive concept will be exemplarily described under the assumption that a non-volatile memory device may be a NAND flash memory device. But, it is well understood that the non-volatile memory device is not limited to the NAND flash memory device. That is, a non-volatile memory device and its operating characteristic being described below may be applied to non-volatile memory devices such as a NAND flash memory device, a NOR flash memory device, a phase-change RAM (PRAM), a ferroelectric RAM (FRAM), a magnetic RAM (MRAM), etc. and various types of flash memory devices regardless of charge storing layer structure.

A read operation of a flash memory device 100 according to an exemplary embodiment of the inventive concept may remove the coupling effect included in a read result of a selected memory cell, based on a program state of a memory cell (hereinafter, referred to as an "adjacent memory cell") adjacent to the selected memory cell. For this, a read operation on the adjacent memory cell may be selectively carried out prior to reading data from the selected memory cell. Upon sensing of data from the selected memory cell, one or more read operations may be performed according to the program state of the adjacent memory cell, with a read voltage during each read operation being changed in level when the program state of the adjacent memory cell may cause coupling to the selected memory cell from a level that would be applied when the adjacent memory cell does not cause coupling to the selected memory cell.

Referring to FIG. 1, flash memory device 100 may include a memory cell array 110, a row decoder 120, a data input/output circuit 130, an input/output buffer 140, control logic 150, and a voltage generator 160.

Memory cell array 110 may store data and include a plurality of memory blocks BLK0 to BLKn. Each of the plurality of memory blocks BLK0 to BLKn may be formed of a plurality of pages each having a plurality of memory cells. With this structural characteristic, flash memory device 100 may perform read and program operations by the page and an erase operation by the block.

Row decoder 120 may be connected with memory cell array 110 via a plurality of word lines (WLs). Row decoder 120 may select a word line of memory cell array 110 according to a received row address. Row decoder 120 may transfer word line voltages from voltage generator 160 to a selected word line. For example, during a programming operation, row decoder 120 may transfer a program voltage Vpgm or a program verify voltage Vvfy from voltage generator 160 to the selected word line, and may transfer a pass voltage Vpass therefrom to unselected word lines. At reading, row decoder 120 may transfer a selection read voltage Vrd from voltage generator 160 to a selected word line and a non-selection read voltage Vread therefrom to unselected word lines.

Data input/output circuit 130 may include a plurality of data input/output circuits 130_0 to 130_m, which are connected to a plurality of corresponding bit lines BL0 to BLm. Data input/output circuit 130 may operate as a write driver or as a sense amplifier according to a mode of operation. For example, during a read operation, data input/output circuit 130 may read data stored in a selected memory cell via a bit line. During a programming operation, data input/output circuit 130 may program input data in a selected memory cell. Data input/output circuit 130 may operate responsive to the control of control logic 150.

A read operation executed by data input/output circuit 130 may include a read operation (also called a normal read operation) and a program verify operation (also called a verify read operation). The program verify operation may be carried out to be identical to the read operation except read data is not provided or output from flash memory device 100. The read operation may be performed with respect to memory cells connected with a selected word line, in units of one or more pages.

Input/output buffer 140 may temporarily store an address, data, and a command received via input/output pins. Input/output buffer 140 may transfer the stored address to an address register (not shown), the stored data to data input/output circuit 130, and the stored command to a command register (not shown). During a read operation, input/output buffer 140 may transfer data from data input/output circuit 130 to an external device.

Control logic 150 may control an overall operation of flash memory device 100 in response to a command and a control signal from an external device (e.g., a host, a memory controller, a memory interface, or the like). For example, control logic 150 may control read, program (or write), and erase operations of flash memory device 100. For the read, program (or write), and erase operations, control logic 150 may control voltage generator 160 to generate a bias voltage.

A read operation according to an exemplary embodiment of the inventive concept may be carried out by control logic 150, data input/output circuit 130, and voltage generator 160. That is, control logic 150 may control data input/output circuit 130 and voltage generator 160 according to the read operation of the inventive concept. With the read operation executed under the control of control logic 150, data may be first read out from an adjacent memory cell of a selected memory cell. Upon sensing of data from the selected memory cell, control logic 150 may control voltage generator 160 such that a read voltage having a voltage level among a first voltage level Vrd_a and a second voltage level Vrd_b, which are different from each other, is provided to a selected word line according to a program state of the adjacent memory cell. That is, during a read operation, control logic 150 may control data input/output circuit 130 and voltage generator 160 such that the selected memory cell is sensed by a read voltage having one of two different levels, respectively, which are selected depending on the program state of the adjacent memory cell.

As understood from the above description, a read operation may be exactly performed even though a threshold voltage distribution corresponding to a selected memory cell is changed due to the electric field coupling or F-poly coupling caused by an adjacent memory cell. Also, since a program state of the adjacent memory cell is temporarily stored by data input/output circuit 130, it is possible to shorten a time needed for a read operation of a selected memory cell.

Figure 2:
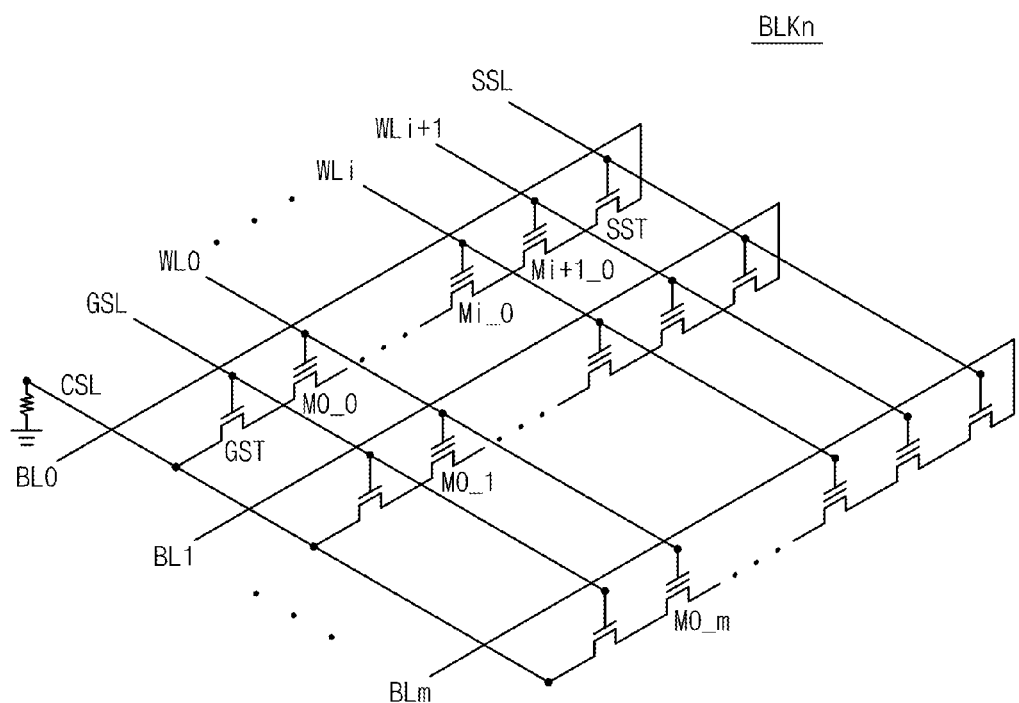
FIG. 2 is an equivalent circuit diagram of a memory cell array illustrated in FIG. 1.

FIG. 2 is an equivalent circuit diagram of a memory cell array illustrated in FIG. 1. In FIG. 2, there is exemplarily illustrated one memory block BLKn included in memory cell array 110 in FIG. 1.

The memory block BLKn may include a plurality of cell strings each connected with a plurality of bit lines BL0 to BLm. Each of the cell strings may include a plurality of memory cells connected between a corresponding bit line and a common source line CSL. For example, a cell string may include a plurality of memory cells M0_0 to Mi+1_0 connected between a corresponding bit line BL0 and the common source line CSL. Each cell string may further include a string select transistor SST connected with a string select line SSL and a ground select transistor GST connected with a ground select line GSL. In each cell string, the string select transistor SST is connected with a corresponding bit line, and the ground select transistor GST is connected with the common source line CSL.

Memory cells connected with each of word lines WL0 to WLi+1 may constitute a page. For example, memory cells M0_0 to M0_m connected with the word line WL0 may constitute one page. In case of a multi-level cell (MLC) storing n-bit data (n being an integer of 2 or more), memory cells connected with one word line may constitute plural pages. If page addresses are scrambled, the page order may be different from a word line order. A page may represent the unit of a read or program operation. Accordingly, a read or program operation may be carried out according to a page order.

The term "an adjacent memory cell" may be used as a descriptive term. An adjacent memory cell may include a memory cell which is connected with a word line (hereinafter, referred to as an adjacent word line) adjacent (or immediately adjacent) to a selected memory cell. The adjacent memory cell may be a memory cell being programmed following a selected memory cell and may affect a threshold voltage of the selected memory cell.

It is assumed that a memory cell Mi_0 is a selected memory cell. With this assumption, a word line WLi connected with the selected memory cell Mi_0 may be a selected word line, and a word line adjacent (e.g., immediately adjacent) to the selected word line WLi may be an adjacent word line WLi+1. Among memory cells connected with the adjacent word line WLi+1, a memory cell Mi+1_0 may be a memory cell which is adjacent (e.g., immediately adjacent) to the selected memory cell Mi_0, is programmed following the selected memory cell Mi_0, and affects a threshold voltage of the selected memory cell.

A threshold voltage of the selected memory cell may be affected according to a program state (or, a threshold voltage) of the adjacent memory cell. For example, a threshold voltage of the selected memory cell may be increased or decreased unintentionally due to the electric field coupling or F-poly coupling caused between the selected memory cell and the adjacent memory cell. This will be more fully described with reference to FIGS. 3 and 4.

Figure 3:
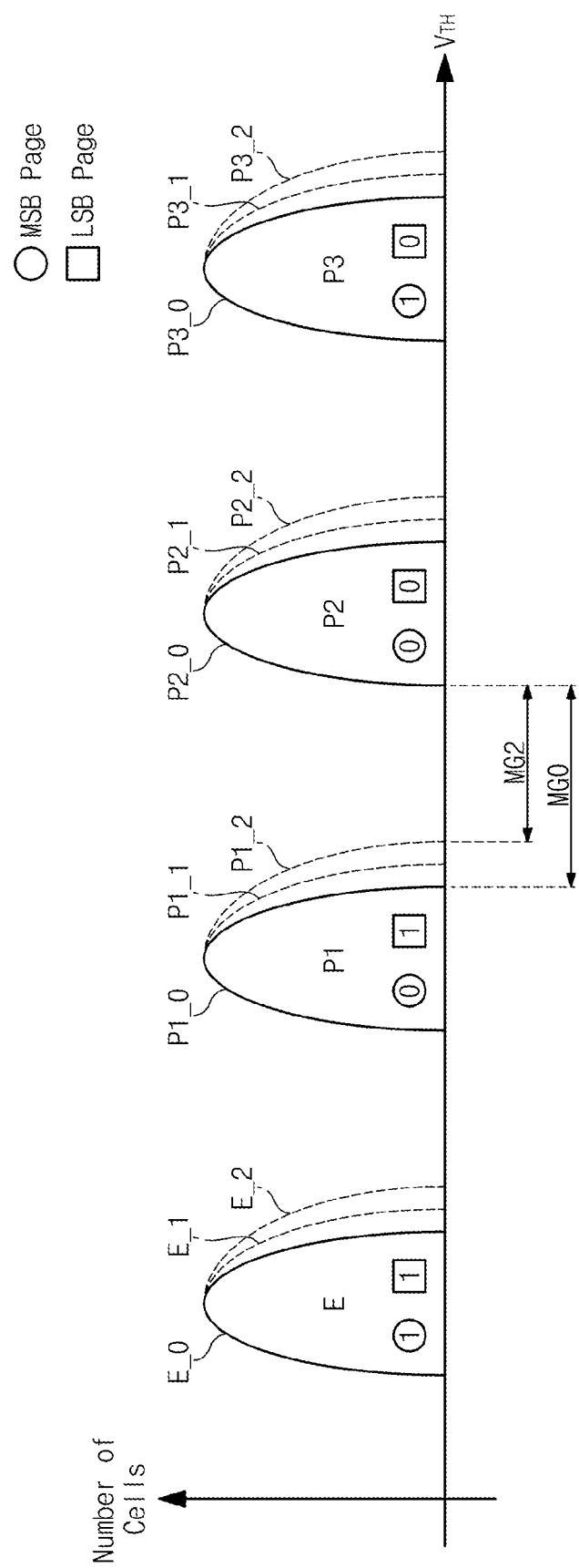
FIGS. 3 and 4 are diagrams for describing the electric field coupling caused between adjacent memory cells.
Figure 4:
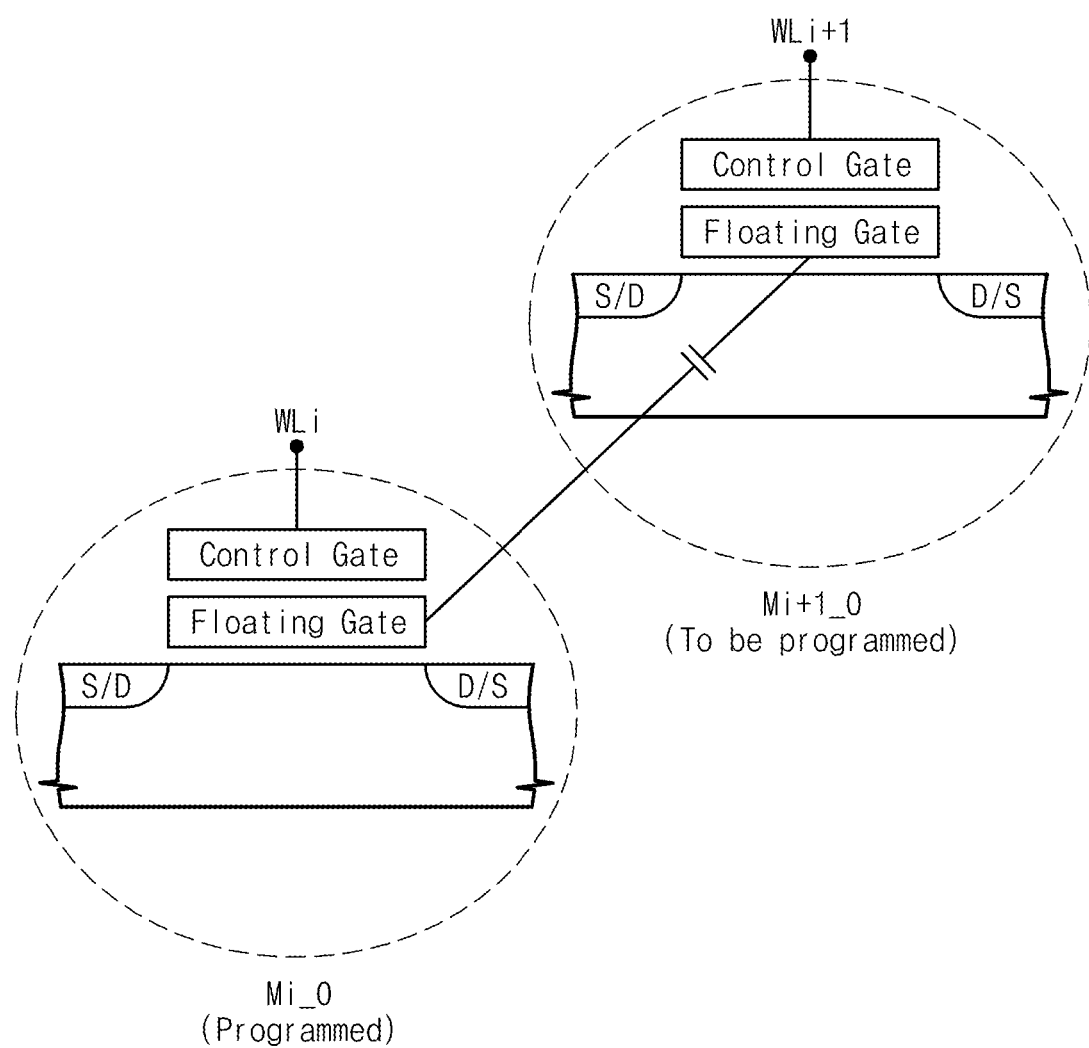

FIGS. 3 and 4 are diagrams for describing the electric field coupling caused between adjacent memory cells.

For ease of description, in FIG. 3, there are exemplarily illustrated threshold voltage distributions of multi-level cells each storing 2-bit data. But, it is well understood that the inventive concept may be applied to multi-level cells each storing 3 or more bits of data. In the case of a multi-level cell storing 2-bit data, the 2-bit data may be formed of lower page data and upper page data which may be stored therein independently.

If one memory cell stores 2-bit data, it may have a threshold voltage in one of four threshold voltage distributions E, P1, P2, and P3. Each of the threshold voltage distributions E, P1, P2, and P3 may correspond to any one of the possible data states, that is, data '11', data '01', data '00', and data '10.' For example, a threshold voltage distribution E representing an erase state may correspond to data '11,' a threshold voltage distribution P1 representing a program state may correspond to data '01,' a threshold voltage distribution P2 representing another program state may correspond to data '00,' and a threshold voltage distribution P3 representing yet another program state may correspond to data '10.'

Herein, correspondence between threshold voltage distributions E, P1, P2, and P3 and data states '11', '01', '00', and '10' is not limited to this disclosure. The correspondence between threshold voltage distributions and data states may be changed variously according to a memory design.

In FIG. 3, solid lines E_0 to P3_0 may represent threshold voltage distributions which are formed within a given threshold voltage window. In this case, threshold voltage distributions P1_0 and P2_) may be formed with a predetermined margin MG0. In FIG. 3, dotted lines E_1 to P3_1 and E_2 to P3_2 may represent threshold voltage distributions shifted when coupling is generated according to program state(s) of one or more adjacent memory cells.

In FIG. 4, it is assumed that a memory cell Mi_0 is connected with a word line WLi and is programmed to have one of four states E, P1, P2, and P3. Further, it is assumed that a memory cell Mi+1_0 is connected with a word line WLi+1 and is programmed to have one of four states E, P1, P2, and P3. The word line WLi+1 may be an adjacent (e.g., immediately adjacent) word line placed above the word line WLi. If a program operation is carried out according to a page order, the memory cell Mi_0 connected with the word line WLi may be programmed, and then the memory cell Mi+1_0 connected with the word line WLi+1 may be programmed.

When the memory cell Mi+1_0 is programmed, charges may be accumulated on its floating gate. This means that a threshold voltage of the memory cell Mi+1_0 increases. At this time, a potential of a floating gate of the previously programmed memory cell Mi_0 may be increased due to the coupling with the floating gate of the memory cell Mi+1_0. The increased potential of the floating gate of the memory cell Mi_0 may be maintained even after programming of the memory cell Mi+1_0 is completed.

The coupling imposed on the memory cell Mi_0 may be caused from all adjacent memory cells which are placed in the word line direction or the bit line direction of the memory cell Mi_0. A threshold voltage of the programmed memory cell Mi_0 may be increased due to the coupling. That is, threshold voltage distributions may be widened as illustrated by the dotted lines E_1 to P3_1 and E_2 to P3_2 in FIG. 3. As threshold voltage distributions are widened due to the coupling, the margin between adjacent threshold voltage distributions may be reduced from MG0 to MG2. This means that the error probability is increased for a sensing operation.

The more there is a variation of program states of adjacent memory cells, the more there may be a variation of a threshold voltage distribution due to the coupling. For example, the solid lines E_0 to P3_0 may represent threshold voltage distributions when adjacent memory cells have an erase state E. That is, when adjacent memory cells have an erase state E, the nearby coupling may be minimal or nil. The dotted lines E_1 to P3_1 may represent threshold voltage distributions when adjacent memory cells have a program state P2. Here, the coupling may be relatively small. On the other hand, the dotted lines E_2 to P3_2 may represent threshold voltage distributions when adjacent memory cells have a program state P1 or a program state P3. That is, when adjacent memory cells are programmed to have a program state P1 or a program state P3, the coupling may be greater.

With an exemplary embodiment of the inventive concept, the coupling effect included in a read result of selected memory cells may be counteracted according to a program status of adjacent memory cells. For this, a read operation on adjacent memory cells may be carried out prior to read data from selected memory cells. Upon sensing of data from the selected memory cells, one or more read operations may be performed according to the program status of the adjacent memory cells, with a read voltage being changed in level when the program state of the adjacent memory cells is one that causes coupling to the selected memory cells, from the level that would be employed when the program state of the adjacent memory cells is one that does not cause coupling to the selected memory cells.

Figure 5:
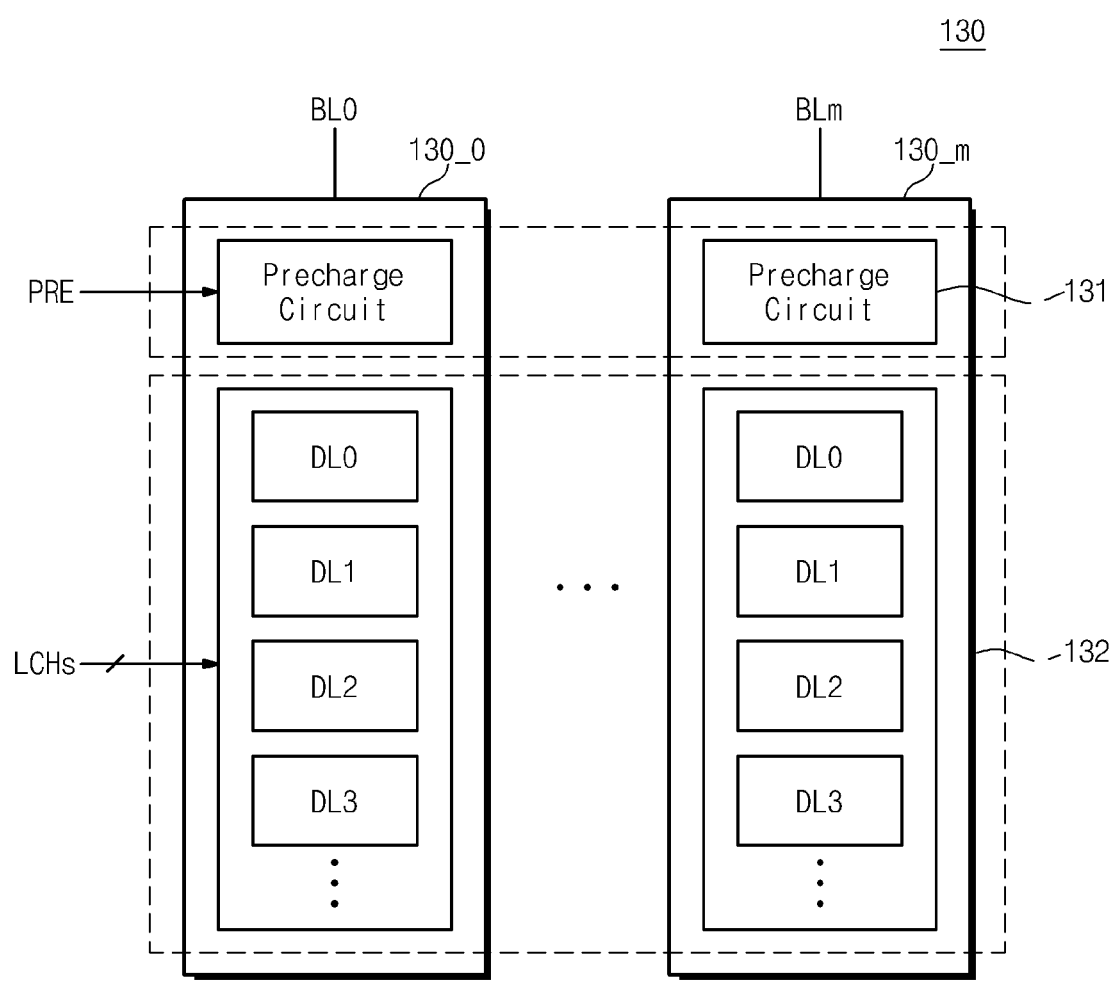
FIG. 5 is a block diagram of a data input/output circuit of a non-volatile memory device according to an exemplary embodiment of the inventive concept.

FIG. 5 is a block diagram of a data input/output circuit of a non-volatile memory device according to an exemplary embodiment of the inventive concept. Referring to FIG. 5, a data input/output circuit 130 may include a plurality of data input/output circuits 130_0 to 130_m each corresponding to bit lines BL0 to BLm. The data input/output circuits 130_0 to 130_m may be configured to be the same as one another. The data input/output circuits 130_0 to 130_m may be configured as follows.

Data input/output circuits 130_0 to 130_m may each include a precharge circuit 131 and a data latch circuit 132.

For of the input/output circuits 130_0 to 130_m, the corresponding precharge circuit 131 is connected with the corresponding bit line and the corresponding data latch circuit 132. During a reading operation, precharge circuit 131 may precharge the corresponding bit line with a predetermined voltage in response to a control signal PRE. Precharge circuit 131 may be formed of a transistor which provides a precharge voltage to the corresponding bit line.

Each data latch circuit 132 may be connected to the corresponding bit line. Data latch circuit 132 may include a plurality of data latches. The number of data latches in data latch circuit 132 may differ according to the number of bits-per-cell. During a read operation, data latch circuit 132 may sense data stored in a memory cell and store the sensed result in one or more data latches in response to a corresponding latch control signal LCH.

A precharge operation may be carried out before a sensing operation which is executed with respect to a memory cell connected with a selected bit line. After the precharge operation of the selected bit line, a precharged voltage of the selected bit line may vary according to a data value programmed in a selected memory cell during a predetermined sensing period. After the predetermined sensing period, data latch circuit 132 may sense a voltage of a sensing node (placed between a precharge circuit and a data latch circuit) and store the sensed result in one or more data latches.

As described above, data latch circuit 132 may include a plurality of data latches. At least one of data latches included in each of data input/output circuits 130_0 to 130_m may be used to sense a selected memory cell and store the sensed result. Among remaining data latches included in each of data input/output circuits 130_0 to 130_m, at least one data latch may be used to sense an adjacent memory cell and store the sensed result.

Data of an adjacent memory cell stored in one or more data latches may be used to adjust an applied read voltage level upon sensing of data from a selected memory cell. Thus, it is possible to compensate for the coupling effect imposed on the selected memory cell according to a program state of the adjacent memory cell.

Figure 6:
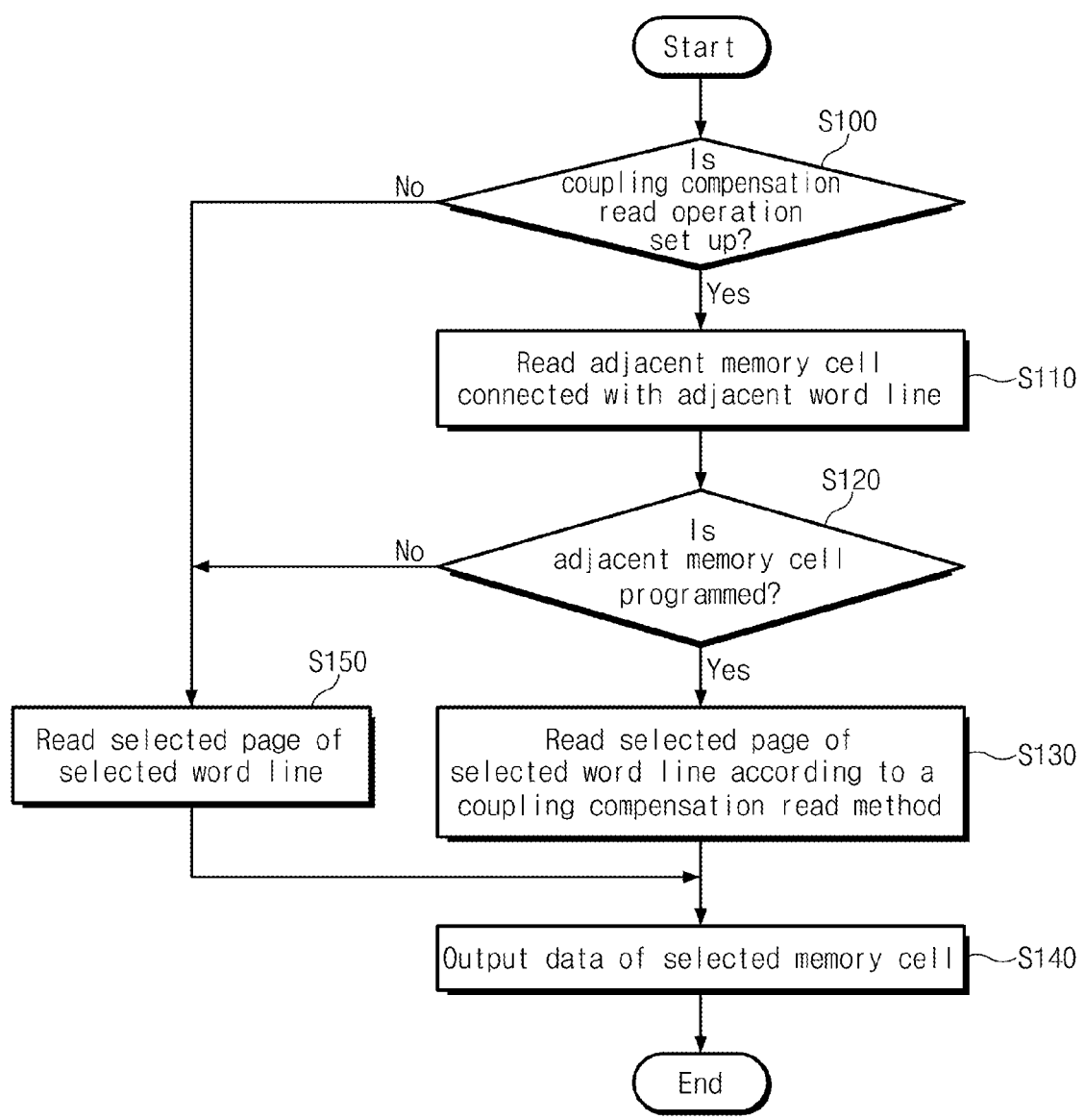
FIG. 6 is a flowchart for describing a read operation according to a first embodiment of the inventive concept.

FIG. 6 is a flowchart for describing a read operation according to the first embodiment of the inventive concept. A read operation according to the first embodiment of the inventive concept will be described under the assumption that a memory cell is a multi level cell storing 2-bit data. In this case, data of memory cells connected with one word line may be formed into two pages, that is, a lower page and an upper page. Further, it is assumed that read and program operations are executed according to a page order. Below, a page to be read will be referred to as a selected page.

In step S100, it may be determined whether a flash memory device is set to perform a coupling compensation read operation. Setting up of the flash memory device may be made in a memory fabricating process and changed by a request of a user.

If the flash memory device is not set to perform a coupling compensation read operation, the method proceeds to step S150, in which a general or normal read operation is performed with respect to a selected page of a selected word line. In step S140, data of the selected memory cell stored in one or more data latches may be provided to an external device.

If the flash memory device is set to perform a coupling compensation read operation, a read operation of the selected memory cell may be performed according to the coupling compensation read method, which will be more fully described in the following steps S110 to S140.

In step S110, a read operation for an adjacent memory cell connected with an adjacent word line may be performed prior to a read operation for the selected memory cell. As described above, data stored in memory cells of a word line may be formed of two pages. Accordingly, if a read operation of the adjacent memory cell is performed, lower page data and upper page data of adjacent memory cells may be stored in one or more data latches, respectively. In step S120, the program state of the adjacent memory cell may be determined according to data stored in the one or more data latches (that is, whether the adjacent memory cell is programmed). The selected memory cell may experience the coupling only when the adjacent memory cell is programmed. Thus, if the adjacent memory cell is not programmed (e.g., if adjacent memory cells in the adjacent word line all are not programmed), the method proceeds to step S150, in which a general read operation is carried out on the selected memory cell.

If the adjacent memory cell is programmed (e.g., if at least one of adjacent memory cells in the adjacent word line is programmed), the method proceeds to step S130, in which the selected page of the selected word line is read according to the coupling compensation read method, which is different from the general read method. With the coupling compensation read method, one or more read operations may be carried out with a read voltage of the selected word line being changed in level from the level that would be employed in the general or normal read operation at step S150. The coupling compensation read method will be more fully described below with respect to FIGS. 7 and 8. Afterwards, data of the selected memory cell read according to the coupling compensation read method may be provided to the external device via input/output buffer 140.

Figure 7:
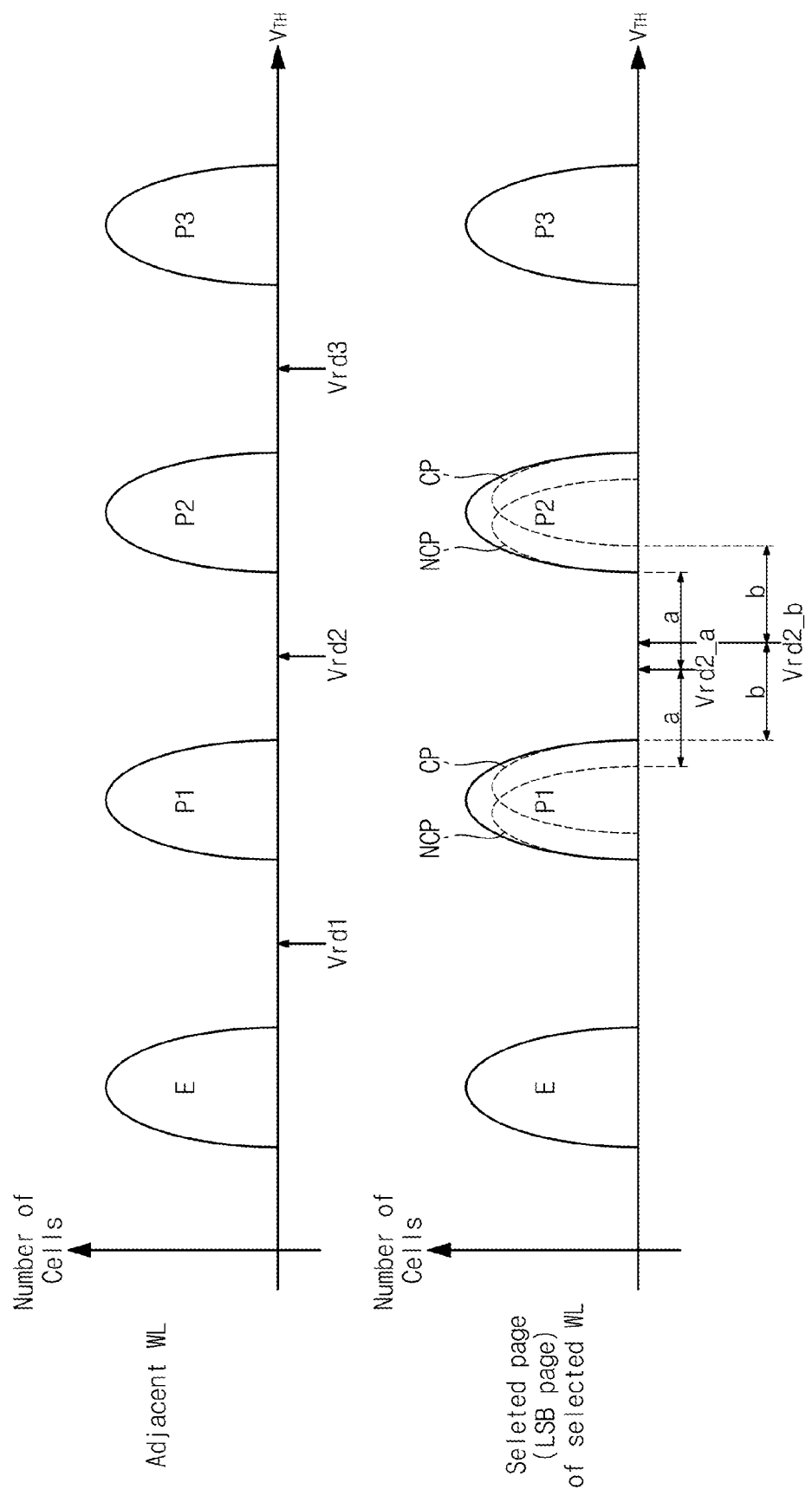
FIGS. 7 and 8 are diagrams for describing a read operation according to the first embodiment of the inventive concept.
Figure 8:
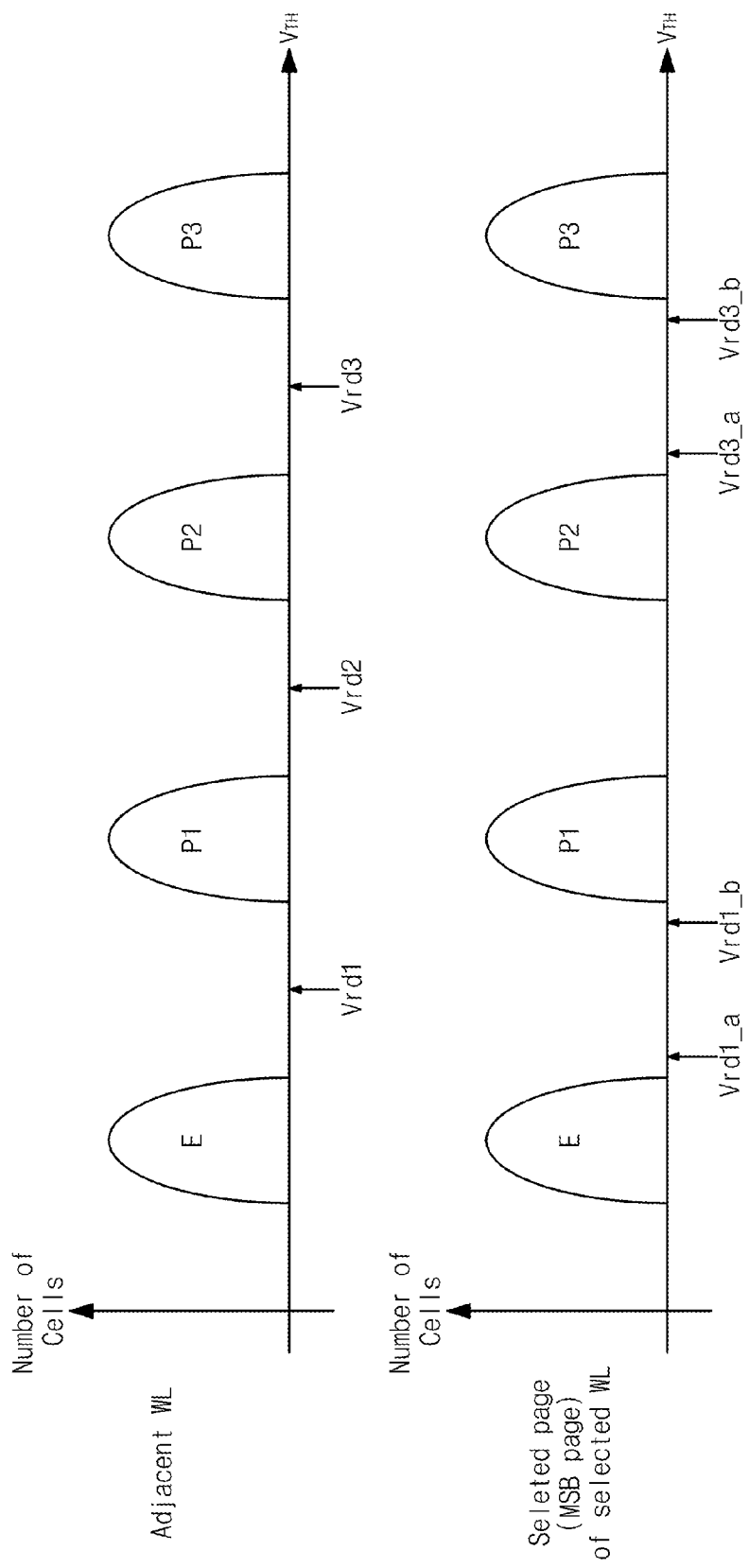

FIGS. 7 and 8 are diagrams for describing a read operation according to the first embodiment of the inventive concept. In FIGS. 7 and 8, there are illustrated read voltage levels according to an operation described in step S110 of FIG. 6 and a coupling compensation read operation described in step S130 of FIG. 6. In particular, FIG. 7 shows read voltage levels that may be applied when lower (LSB) page data of a selected memory cell is read in a coupling compensation read manner. FIG. 8 shows read voltage levels that may be applied when upper (MSB) page data of the selected memory cell is read in the coupling compensation read manner.

During a read operation for adjacent memory cells, an adjacent word line may be supplied with read voltages Vrd1, Vrd2, and Vrd3 for reading LSB page data and MSB page data. An order of applying the read voltages Vrd1, Vrd2, and Vrd3 may be determined sequentially in an ascending order, that is, from a lower voltage to a higher voltage. Alternatively, the read voltage Vrd2 for reading LSB page data of the adjacent memory cells may be firstly applied to the adjacent word line, and then the read voltages Vrd1 and Vrd3 for reading MSB page data of the adjacent memory cells may be applied to the adjacent word line. A program state of the adjacent memory cells may be determined by sensing data from the adjacent memory cells with the read voltages Vrd1, Vrd2, and Vrd3 being applied to the adjacent word line.

Upon reading LSB page data of the selected memory cell, a read voltage Vrd2 having either the first voltage level Vrd2_a or the second voltage level Vrd2_b, which are different than each other, may be applied to the selected word line according to a program state of the adjacent memory cell. A read operation may be carried out whenever the read voltage Vrd having one of the first and second voltage levels Vrd2_a and Vrd2_b, respectively, is applied to the selected word line. If one or more read operations are performed with a read voltage level changed, a read margin may be maintained although a threshold voltage of the selected memory cell is shifted due to the coupling. Accordingly, the data reliability may be improved.

The first and second voltage levels Vrd2_a and Vrd2_b may be determined, respectively, considering the case where the selected memory cell experiences the coupling due to the adjacent memory cell, and the case where the selected memory cell does not experience the coupling due to the adjacent memory cell. That is, the first voltage level Vrd2_a may be determined considering a threshold voltage distribution NCP of the selected memory cell when the selected memory cell does not experience the coupling due to the adjacent memory cell. The second voltage level Vrd2_b may be determined considering a threshold voltage distribution CP of the selected memory cell when the selected memory cell experiences the coupling due to the adjacent memory cell. Accordingly, the second voltage level Vrd2_b may be greater than the first voltage level Vrd2_a.

Upon reading MSB page data of the selected memory cell, read voltages Vrd 1 (having possible voltage levels Vrd1_a or Vrd1_b) and Vrd3 (having possible voltage levels Vrd3_a or Vrd3_b) may be applied sequentially to the selected word line according to a program state of the adjacent memory cell. A read operation may be carried out whenever the read voltages Vrd1 and Vrd3 are applied to the selected word line, respectively. The voltage levels Vrd1_a and Vrd3_a may be determined considering a threshold voltage distribution of the selected memory cell when the selected memory cell does not experience the coupling due to the adjacent memory cell. The voltage levels Vrd1_b and Vrd3_b may be determined considering a threshold voltage distribution of the selected memory cell when the selected memory cell experiences the coupling due to the adjacent memory cell.

With the above-described read procedure, a read operation of an adjacent memory cell may be carried out prior to read a selected memory cell. That is, a read operation of the adjacent memory cell may be carried out prior to reading LSB page data of the selected memory cell. A read operation of the adjacent memory cell may be carried out prior to reading MSB page data of the selected memory cell. As a result, a read margin may be maintained although a threshold voltage of the selected memory cell is shifted due to the coupling. Accordingly, the data reliability may be improved.

Figure 9:
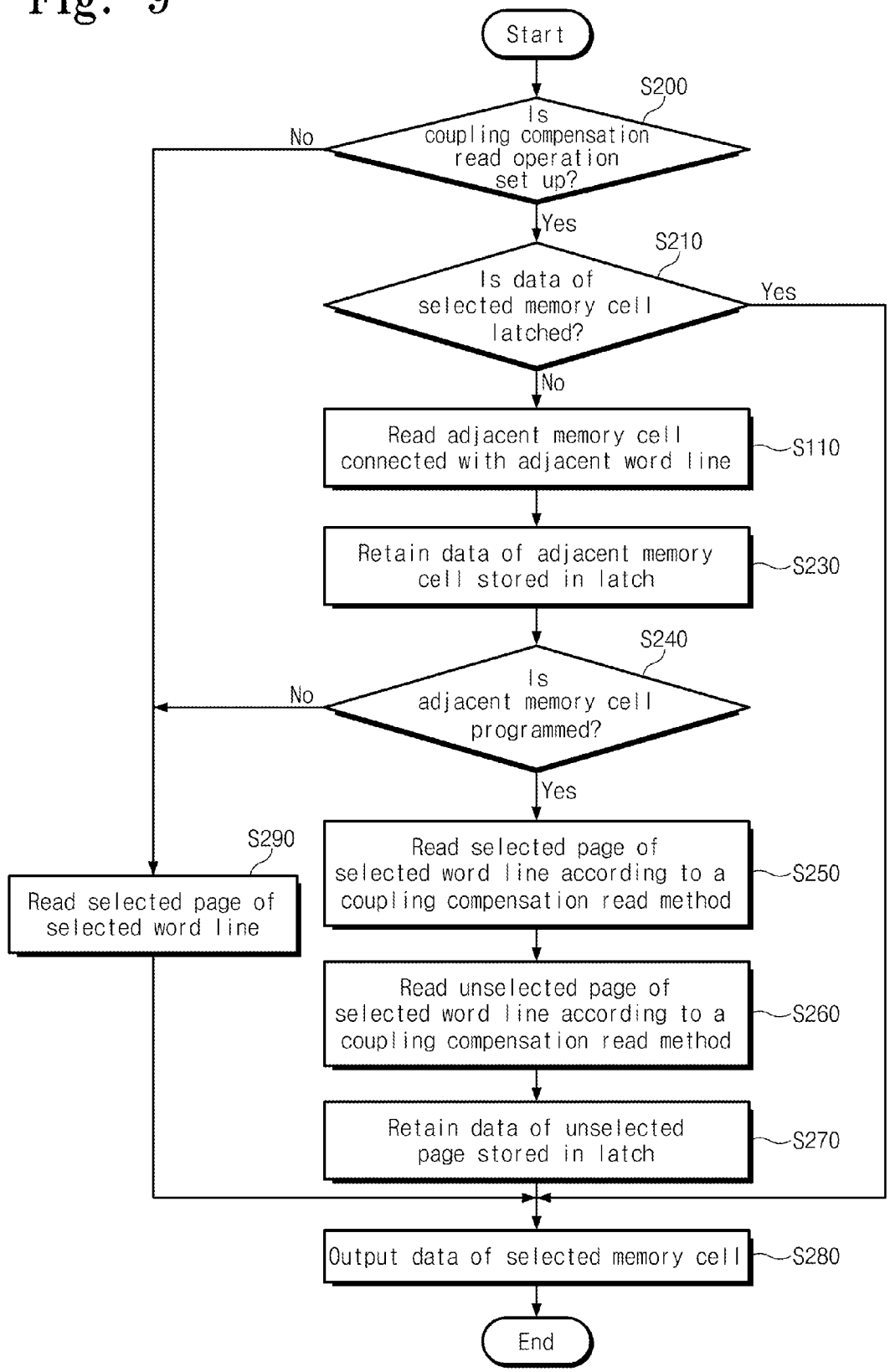
FIG. 9 is a flowchart for describing a read operation according to a second embodiment of the inventive concept.

FIG. 9 is a flowchart for describing a read operation according to a second embodiment of the inventive concept. A read operation according to the second embodiment of the inventive concept will be described under the assumption that a memory cell is a multi level cell storing 2-bit data. In this case, data of memory cells connected with one word line may be formed into two pages, that is, a lower page and an upper page. Further, it is assumed that read and program operations are executed according to a page order. Below, a page to be read will be referred to as a selected page.

In step S200, it may be determined whether a flash memory device is set to perform a coupling compensation read operation. Setting up of the flash memory device may be made in a memory fabricating process and changed by a request of a user.

If the flash memory device is not set to perform a coupling compensation read operation, the method proceeds to step S290, in which a general read operation is performed with respect to a selected page of a selected word line. In step S280, data of the selected memory cell stored in one or more data latches may be provided to an external device.

If the flash memory device is set to perform a coupling compensation read operation, a read operation of the selected memory cell may be performed according to the coupling compensation read method, which will be more fully described in the following steps S210 to S280.

First of all, in step S210, it may be determined whether data of the selected memory cell is stored in one or more data latches. The coupling compensation read operation may be carried out according to whether data of the selected memory cell is stored in one or more data latches. If data of the selected memory cell is stored in one or more data latches, the method proceeds to step S280 without execution of a read operation. In step S280, data of the selected memory cell stored in the one or data latches may be provided to an external device.

If data of the selected memory cell is not stored in one or more data latches, the method proceeds to step S220, in which a read operation for the adjacent memory cell connected with the adjacent word line is performed prior to read the selected memory cell. As described above, data in memory cells of a word line may be formed of two pages. Accordingly, if a read operation for the adjacent memory cell is performed, LSB and MSB page data thereof may be stored in data latches, respectively.

Data of the adjacent memory cell stored in the data latch(es) may be maintained until there is carried out a read operation for another adjacent memory cell which is performed prior to reading another selected memory cell, in step S230. Alternatively, data of the adjacent memory cell stored in the data latch(es) may be maintained until a read operation for an unselected page of the selected word line is carried out. As a result, it is possible to reduce the number of read operations for the adjacent memory cell since data of the adjacent memory cell is referred to as occasion demands.

In step S240, a program state of the adjacent memory cell may be determined based on the data stored in the data latch(es). The selected memory cell may experience the coupling only when the adjacent memory cell is programmed. Accordingly, if the adjacent memory cell is not programmed (or, if all adjacent memory cells in the adjacent word line are not programmed), data of the selected memory cell may be read according to the general read manner in step S290.

If the adjacent memory cell is programmed (or, if any one or more of the adjacent memory cells in the adjacent word line is programmed), in step S250 data of the selected memory cell may be read according to the coupling compensation read manner. That is, the selected page of the selected word line may be read via the coupling compensation read operation. The coupling compensation read operation of the selected page may include performing one or more read operations which use different read voltages, respectively. Each of these read voltages may have a different voltage level in a coupling compensation read operation than they would have in the normal or general read operation where the adjacent memory cells do not cause coupling to the selected memory cell That is, as described in FIGS. 7 and 8, one or more read operations for the selected page may be carried out using one or more read voltages which have voltage levels that are each determined according to whether the selected memory cell experiences the coupling due to the adjacent memory cell or not.

After the selected page is read and stored in one or more data latches, in step S260 an unselected page of the selected word line may be read via the coupling compensation read operation. This may be carried out referring to data of the adjacent memory cell stored in step S230. If the unselected page of the selected word line is read, in step S270, data of the unselected page may be stored in and maintained by one or more data latches. The data of the unselected page stored in the data latch(es) may be provided to an external device via input/output buffer 140 upon a following read request on the unselected page.

After data for a read operation (i.e., a read operation on an unselected page of the selected word line) being expected following the read operation on the selected page is prepared, in step S280, data of the selected memory cell stored in the data latch(es) may be provided to an external device via input/output buffer 140.

With the second embodiment of the inventive concept, a read operation for an adjacent memory cell may be carried out before a selected memory cell is read. Data read from the adjacent memory cell may be retained for a predetermined time period. A coupling compensation read operation may be performed to read a selected page (e.g., a lower page) of the selected memory cell, based on the data of the adjacent memory cell. Further, there may be made a coupling compensation read operation on an unselected page (e.g., an upper page) of the selected memory cell which is expected to be requested later. At this time, reference may be made to data of the adjacent memory cell stored in data latches. Data of the unselected page (e.g., an upper page) of the selected memory cell may be maintained for a predetermined time period. The data of the unselected page may be provided to an external device upon a read request on the unselected page (e.g., an upper page).

As understood from the above description, although a threshold voltage of a selected memory cell is shifted due to the coupling, a read margin may be maintained. This means that the data reliability is improved. Further, the number of read operations that are performed for an adjacent memory cell may be reduced, and a read speed may be improved since data to be requested later is prepared in advance.

FIG. 10 is a diagram for describing a read operation according to the second embodiment of the inventive concept. In FIG. 10, there is illustrated a table of data stored in data latches DL0 to DL4 when a coupling compensation read operation is carried out. Further, in FIG. 10, there is illustrated a manner of scrambling page addresses in the event that a memory cell is a multi level cell (MLC) storing 2 bits of data. It is assumed that a read operation is performed in a page order with all pages being programmed.

If a read operation of a page P0 commences, first of all, data may be read from adjacent memory cells connected with an adjacent word line WL1. Lower (LSB) page data of the adjacent memory cells are stored in data latch(es) DL0, and upper (MSB) page data of the adjacent memory cells are stored in data latch(es) DL1.

A selected page P0 of the selected word line WL0 may be read according to a coupling compensation read manner based on a program state of the adjacent memory cells stored in the data latch(es) DL0 and DL1. Read data of the selected page may be stored in data latch(es) DL4.

Then, an unselected page P2 of the selected word line WL0 may be read according to a coupling compensation read manner based on a program state of the adjacent memory cells as indicated by the data stored in the data latches DL0 and DL1. Data of the adjacent memory cells stored in the data latches DL0 and DL1 may be retained continuously. Data of the unselected page P2 may be stored in data latches DL3. Afterwards, data of the selected page P0 stored in the data latches DL4 may be provided to an external device via input/output buffer 140.

After the page data P0 is output, a read operation of a page P1 may be carried out sequentially. If a read operation of the page P1 is performed, data may be read out from memory cells connected with an adjacent word line WL2. Likewise, LSB page data of adjacent memory cells in the adjacent word line WL2 may be stored in the data latch(es) DL0, and MSB page data thereof may be stored in the data latch(es) DL1.

Data of the selected page P1 in the selected word line WL1 may be read according to the coupling compensation read manner, based on a program state of the adjacent memory cell as indicated by the data stored in the data latches DL0 and DL1. The read data of the selected page P1 may be stored in the data latch(es) DL4.

Afterwards, data of an unselected page P4 in the selected word line WL4 may be read according to the coupling compensation read manner, based on a program state of the adjacent memory cells as indicated by the data stored in the data latches DL0 and DL1. The data of the adjacent memory cells stored in the data latches DL0 and DL1 may be maintained. Data of the unselected page P4 may be stored in data latch(es) DL2. Afterwards, data of the selected page P1 stored in the data latch(es) DL4 may be provided to the external device via input/output buffer 140.

After data of the page P1 is output, a read operation of a page P2 may be performed sequentially. If the read operation of the page P2 is performed, data of the selected page P2 stored in the data latch(es) DL3 may be shifted into the data latch(es) DL4. The data of the selected page P2 stored in the data latch(es) DL4 may be provided to the external device via input/output buffer 140. Alternatively, the data of the selected page P2 stored in the data latch(es) DL3 may be provided to the external device via input/output buffer 140.

A read operation for the pages which follow may be carried out according to the above-described manner. With the second embodiment of the inventive concept, although a threshold voltage of a selected memory cell is shifted due to the coupling, a read margin may be maintained. This means that the data reliability is improved. Further, the number of read operations that are performed for an adjacent memory cell may be reduced, and a read speed may be improved since data to be requested later is prepared.

FIG. 11 is a diagram for describing a read operation according to a third embodiment of the inventive concept. In FIG. 11, there is illustrated a table of data stored in data latches DL0 to DL3 when a coupling compensation read operation is carried out. A read operation according to the third embodiment of the inventive concept may be identical to a read operation according to the second embodiment of the inventive concept except for a method of storing data of an adjacent memory cell in data latches.

As described in FIG. 3, a variation of a threshold voltage of a selected memory cell due to the coupling may increase as a variation of a program state of an adjacent memory cell becomes large. For example, in a case where a memory cell is programmed to a target program state from any program state, the largest coupling effect may be caused when an adjacent memory cell is programmed to a target program state P1 or P3.

With a read method of the third embodiment of the inventive concept, instead of storing data of an adjacent memory cell in data latches, there may be stored whether a program state of the adjacent memory cell is a program state forcing the largest coupling effect to a selected memory cell. For example, one or more data latches may store data indicating whether a program state of the adjacent memory cell is a program state P1 or a program state P3. Data of a selected page may be read according to a coupling compensation read method, as described in FIG. 9, when a program state of the adjacent memory cell is a program state P1 or a program state P3. With a read method of the third embodiment of the inventive concept, it is possible to reduce the number of data latches needed for the coupling compensation read operation.

Figure 12:
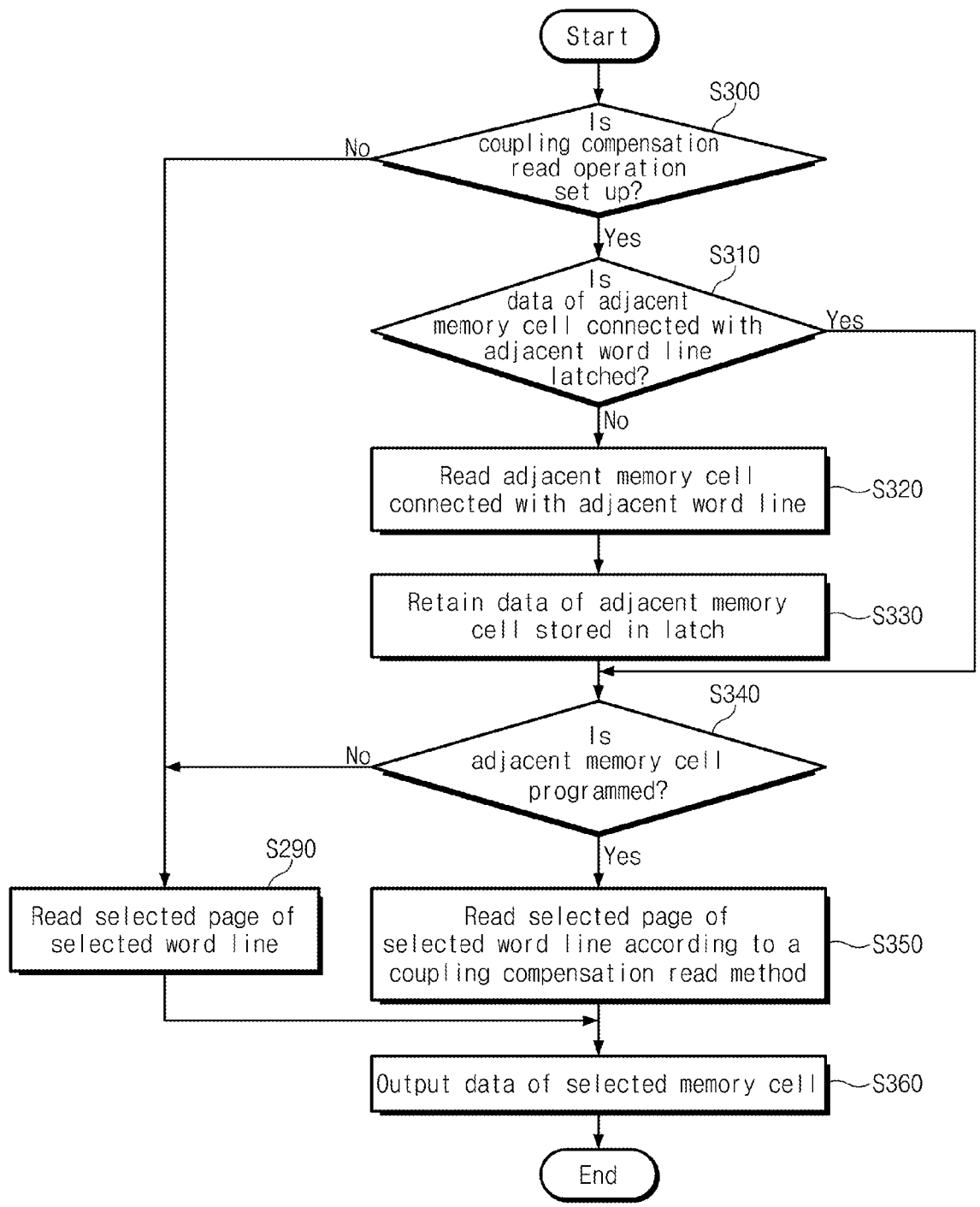
FIG. 12 is a flowchart for describing a read operation according to a fourth embodiment of the inventive concept.

FIG. 12 is a flowchart for describing a read operation according to a fourth embodiment of the inventive concept.

A read operation according to the fourth embodiment of the inventive concept will be described under the assumption that a memory cell is a multi level cell storing 2-bit data. In this case, data of memory cells connected with one word line may be formed into two pages, that is, a lower page and an upper page. Further, it is assumed that read and program operations are executed according to a page order. Below, a page to be read will be referred to as a selected page.

In step S300, it may be determined whether a flash memory device is set to perform a coupling compensation read operation. Setting up of the flash memory device may be made in a memory fabricating process and changed by a request of a user.

If the flash memory device is not set to perform a coupling compensation read operation, the method proceeds to step S370, in which a general read operation is performed with respect to a selected page of a selected word line. In step S360, data of the selected memory cell stored in a data latch may be provided to an external device.

If the flash memory device is set to perform a coupling compensation read operation, a read operation of the selected memory cell may be performed according to the coupling compensation read method, which will be more fully described in the following steps S310 to S360.

First of all, in step S310, it may be determined whether data of the selected memory cell is stored in one or more data latches. If data of the selected memory cell is stored in the data latch(es), the method proceeds to step S340 without execution of a read operation for the adjacent memory cell. In step S340, it may be determined whether the adjacent memory cell is programmed.

If data of the selected memory cell is not stored in the data latch(es), the method proceeds to step S320, in which a read operation for the adjacent memory cell connected with the adjacent word line is performed prior to read the selected memory cell. As described above, data in memory cells of a word line may be formed of two pages. Accordingly, if a read operation for the adjacent memory cell, LSB and MSB page data thereof may be stored in data latches, respectively.

As indicated in step 330, data of the adjacent memory cell stored in the data latch may be maintained until there is carried out a read operation for all unselected pages of the selected word line. As a result, it is possible to reduce the number of read operations for the adjacent memory cell since data of the adjacent memory cell is referred to as occasion demands.

In step S340, a program state of the adjacent memory cell may be determined based on data stored in the data latch(es). The selected memory cell may experience the coupling only when the adjacent memory cell is programmed. Accordingly, if the adjacent memory cell is not programmed (or, if all adjacent memory cells in the adjacent word line are not programmed), data of the selected memory cell may be read according to the general or normal read operation in step S370.

If the adjacent memory cell is programmed (or, if any one or more of the adjacent memory cells in the adjacent word line is programmed), in step S350 data of the selected memory cell may be read according to the coupling compensation read operation as described above. That is, the selected page of the selected word line may be read via the coupling compensation read operation. The coupling compensation read operation of the selected page may include performing one or more read operations which use different read voltages, respectively. Each of these read voltages may have a different voltage level in a coupling compensation read operation than they would have in the normal or general read operation where the adjacent memory cells do not cause coupling to the selected memory cell. That is, as described in FIGS. 7 and 8, one or more read operation for the selected page may be carried out using one or more voltage levels which are determined according to whether the selected memory cell experiences the coupling due to the adjacent memory cell or not. In step S360, data of the selected memory cell stored in the data latch(es) may be provided to the external device via input/output buffer 140.

With the fourth embodiment of the inventive concept, a read operation for an adjacent memory cell may be carried out before a selected memory cell is read. Data read from the adjacent memory cell may be retained for a predetermined time period. For example, the read data of the adjacent memory cell may be retained until there is performed a read operation on all unselected pages of the selected memory cell which is expected to be requested later.

As understood from the above description, although a threshold voltage of a selected memory cell is shifted due to the coupling, a read margin may be maintained. This means that the data reliability is improved. Further, the number of read operations that are performed for an adjacent memory cell may be reduced since retained data of the adjacent memory cell is referred at a read operation to be requested later. As a result, a read speed may be improved.

FIG. 13 is a diagram for describing a read operation according to the fourth embodiment of the inventive concept. In FIG. 13, there is illustrated a table of data stored in data latches DL0 to DL4 when a coupling compensation read operation is carried out. Further, in FIG. 10, there is illustrated a manner of scrambling page addresses in the event that a memory cell is a multi level cell MLC storing 2 bits of data. It is assumed that a read operation is performed in a page order with all pages being programmed.

If a read operation of a page P0 commences, first of all, data may be read from adjacent memory cells connected with an adjacent word line WL1. Lower (LSB) page data of the adjacent memory cells are stored in data latch(es) DL2, and upper (MSB) page data of the adjacent memory cells are stored in data latch(es) DL3.

A selected page P0 of the selected word line WL0 may be read according to a coupling compensation read operation based on a program state of the adjacent memory cells stored in the data latches DL2 and DL3. Read data of the selected page may be stored in data latch(es) DL4. Afterwards, data of the selected page P0 stored in the data latches DL4 may be provided to an external device via an input/output buffer 140.

After the page data P0 is output, a read operation of a page P1 may be carried out sequentially. If a read operation of the page P1 is performed, data may be read out from memory cells connected with an adjacent word line WL2. Likewise, LSB page data of adjacent memory cells in the adjacent word line WL2 may be stored in the data latch(es) DL0, and MSB page data thereof may be stored in the data latch(es) DL1.

Data of the selected page P1 in the selected word line WL1 may be read according to the coupling compensation read operation, based on a program state of the adjacent memory cell stored in the data latches DL2 and DL3. The read data of the selected page P1 may be stored in the data latch(es) DL4. Afterwards, data of the selected page P1 stored in the data latch(es) DL4 may be provided to the external device via input/output buffer 140.

After data of the page P1 is output, a read operation of a page P2 may be performed sequentially. If the read operation of the page P2 is performed, data may not be read from memory cells of an adjacent word line WL1. The reason is that data of adjacent memory cells connected with the adjacent word line WL1 remains stored in one or more data latches after data of the page P0 is read according to the coupling compensation read operation. Thus, data of the selected page P2 may be read according to the coupling compensation read operation, based on the retained program state of the adjacent memory cell. The read data of the selected page P2 may be stored in data latch(es) DL4. Afterwards, data of the selected page P1 stored in the data latch(es) DL4 may be provided to the external device via input/output buffer 140.

With the fourth embodiment of the inventive concept, although a threshold voltage of a selected memory cell is shifted due to the coupling, a read margin may be maintained. This means that the data reliability is improved. Further, the number of read operations that are performed for an adjacent memory cell may be reduced since retained data of an adjacent memory cell is referred at a read operation to be requested later. Accordingly, a read speed may be improved.

Figure 14:
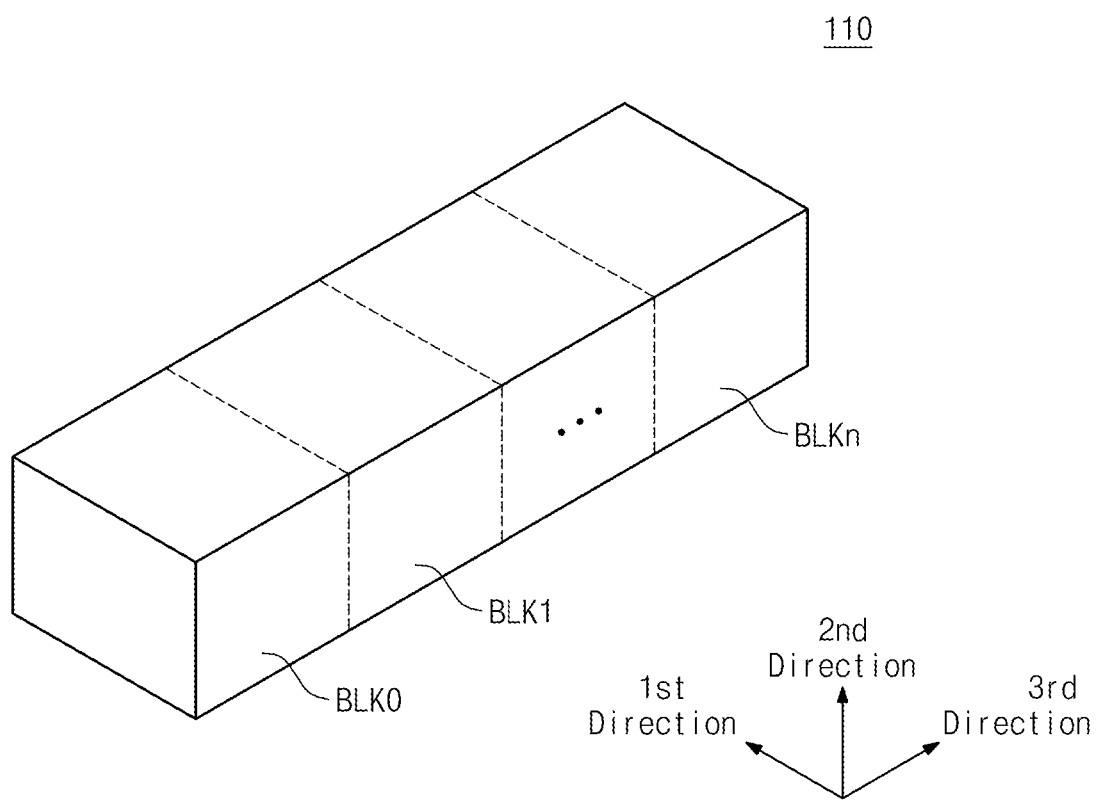
FIG. 14 is a block diagram of a memory cell array in FIG. 1 according to another embodiment of the inventive concept.

FIG. 14 is a block diagram of a memory cell array 100 in FIG. 1 according to another embodiment of the inventive concept.

Referring to FIG. 14, memory cell array 110 may include a plurality of memory blocks BLK1 to BLKn, each of which has a 3D structure (or, a vertical structure). For example, each memory block BLK may include structures extending along the first to third directions as indicated in FIG. 14. For example, each memory block BLK may include a plurality of NAND strings NS extended along the second direction. For example, a plurality of NAND strings NS may extend along the first and third directions.

Each NAND string NS may be coupled with a bit line BL, at least one string selection line SSL, at least one ground selection line GSL, word lines WL, at least one dummy word line DWL, and a common source line CSL. That is, each memory block may be coupled with a plurality of bit lines BL, a plurality of string selection lines SSL, a plurality of ground selection lines GSL, a plurality of word lines WL, a plurality of dummy word lines DWL, and a common source line CSL. The memory blocks BLK1 to BLKn will be more fully described with reference to FIG. 15.

Figure 15:
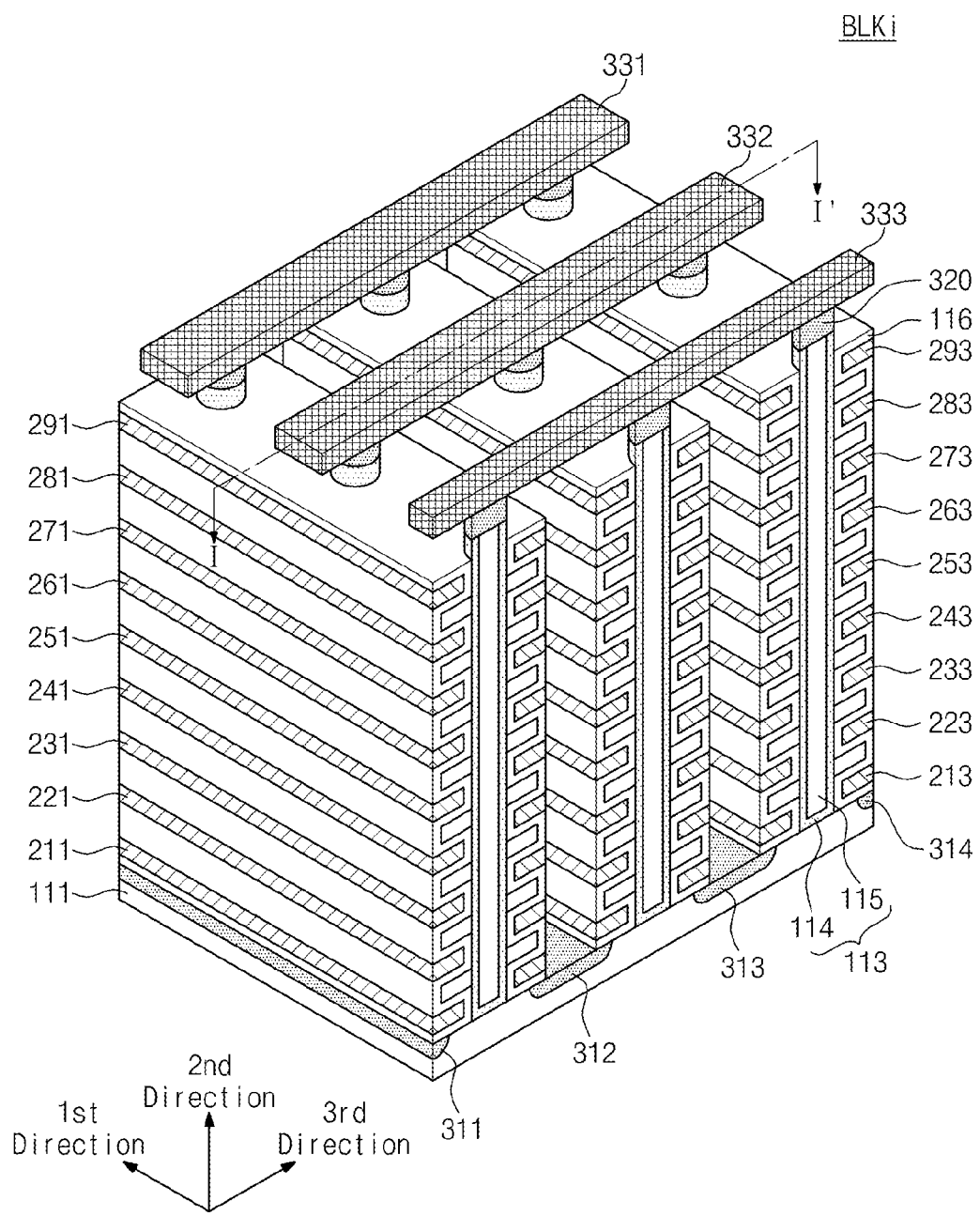
FIG. 15 is a perspective view of one of memory blocks in FIG. 14.
Figure 16:
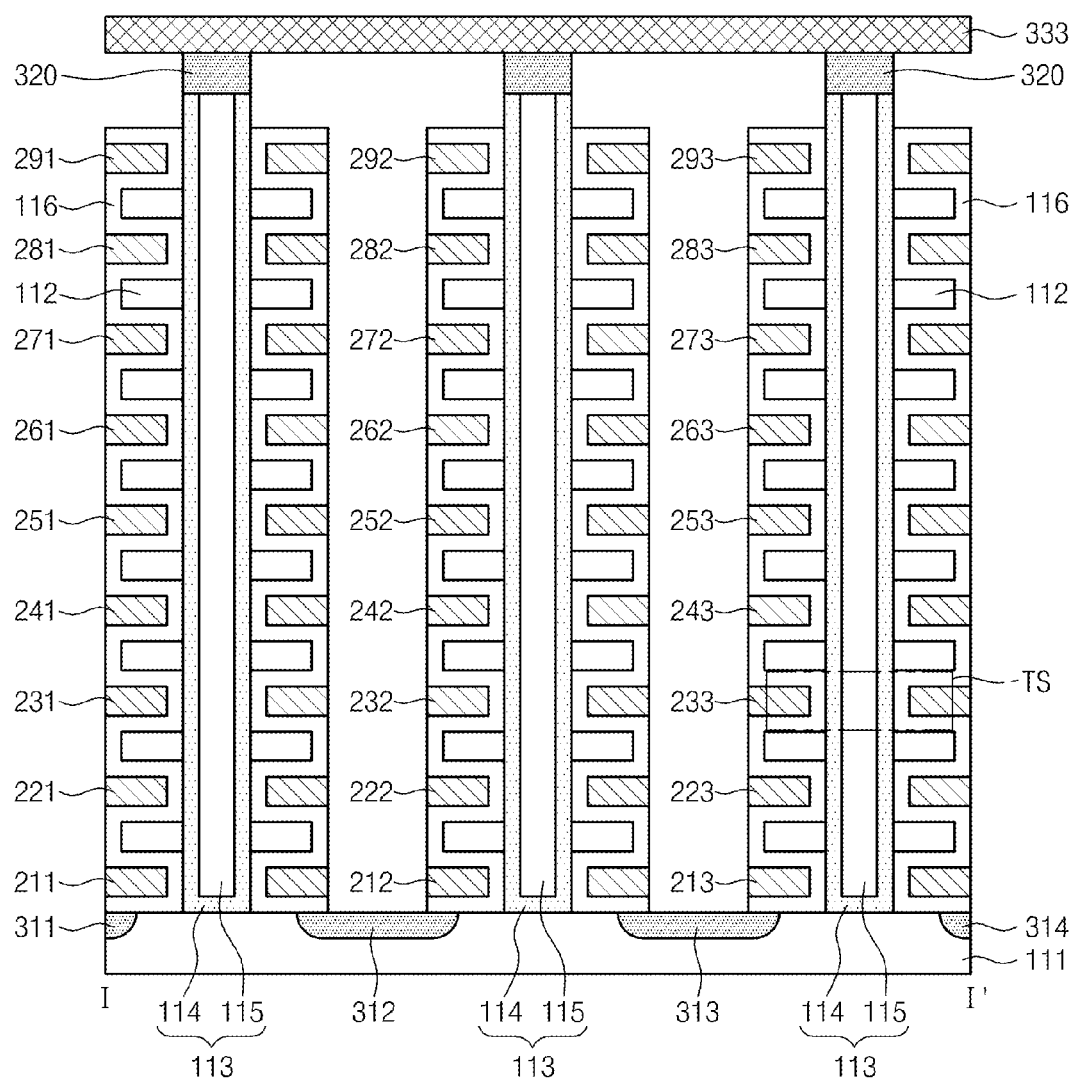
FIG. 16 is a cross-sectional view taken along a line I-I' of a memory block in FIG. 15.

FIG. 15 is a perspective view of one of the memory blocks BLKi in FIG. 14, and FIG. 16 is a cross-sectional view taken along a line I-I' of memory block BLKi in FIG. 15. Referring to FIGS. 15 and 16, a memory block BLKi includes structures that extend in the first to third directions as indicated in FIG. 15.

First, a substrate 111 is provided. Exemplarily, substrate 111 may include a silicon material to which a first type impurity is injected. For example, substrate 111 may include a silicon material to which a p-type impurity is injected. As an example, substrate 111 may be a p-type well (or, a pocket p well). For example, substrate 111 may further include an n-type well which surrounds the p-type well. Hereinafter, it is assumed that substrate 111 is p-type silicon. However, substrate 111 is not limited thereto.

A plurality of doping regions 311 to 314 extending in the first direction may be provided to substrate 111. For example, a plurality of doping regions 311 to 314 may have a second type of impurity different from that of substrate 111. For example, doping regions 311 to 314 may have an n-type impurity, respectively. Hereinafter, it is assumed that first to fourth doping regions 311 to 314 are n-type regions. However, first to fourth doping regions 311 to 314 are not limited thereto.

In a region on substrate 111 between first and second doping regions 311 and 312, a plurality of insulating materials 112 each extending in the first direction may be sequentially provided in the second direction. For example, the plurality of insulating materials 112 and substrate 111 may be formed to be separated by a predetermined distance in the second direction. For example, insulating materials 112 may be separated from each other by a predetermined distance in the second direction. Exemplarily, insulating materials 112 may include an insulating material such as silicon oxide.

In the region on substrate 111 between first and second doping regions 311 and 312, a plurality of pillars 113 may be provided which are sequentially disposed in the first direction and pass through insulating materials 112 in the second direction. Exemplarily, pillars 113 may be disposed on substrate 111 and separated therefrom through insulating materials 112, respectively.

Exemplarily, each of pillars 113 may be formed of a plurality of materials. For example, surface layer 114 of each pillar 113 may include a silicon material having the first type. For example, surface layer 114 of each pillar 113 may include a silicon material which is doped by same type as substrate 111. Hereinafter, it is assumed that surface layer 114 of each pillar 113 includes p-type silicon. However, surface layer 114 of each pillar 113 is not limited thereto.

Inner layer 115 of each pillar 113 may be formed of an insulating material. For example, inner layer 115 of each pillar 113 may be filled by an insulating material such as silicon oxide.

In a region between first and second doping regions 311 and 312, an insulation layer 116 may be provided along the exposed surface of substrate 11, insulating materials 112, and pillars 113. For example, the thickness of insulation layer 116 may be less than half a distance between insulating materials 112. That is, a region where a material other than insulating materials 112 and insulation layer 116 may be disposed, may be provided between a portion of insulation layer 116 provided next to a lower surface of the first insulating material among insulating materials 112 and a portion of insulation layer 116 provided next to an upper surface of the second insulating material, and beneath the first insulating material.

In the region between first and second doping regions 311 and 312, conductive materials 211 to 291 may be provided onto an exposed surface of insulation layer 116. For example, conductive material 211 extending in the first direction may be provided between substrate 111 and insulating material 112 adjacent to substrate 111. More specifically, conductive material 211 extending in the first direction may be provided between substrate 111 and insulation layer 116 of the lower surface of insulating material 112 adjacent to substrate 111.

A conductive material extending in the first direction may be provided between: (1) a portion of insulation layer 116 disposed next to an upper surface of a specific insulating material among insulating materials 112, and (2) a portion of insulation layer 116 disposed next to a lower surface of an insulating material disposed above the specific insulating material. Exemplarily, conductive materials 221 to 281 extended in the first direction may be provided between insulating materials 112. Exemplarily, first conductive materials 211 to 291 may be metal materials. Exemplarily, conductive materials 211 to 291 may be conductive materials such as polysilicon.

The same structure as first and second doping regions 311 and 312 may be provided between second and third doping regions 312 and 313. Between second and third doping regions 312 and 313, exemplarily, there may be provided insulating materials 112 extending in the first direction, pillars 113 sequentially disposed in the first direction and passing through insulating materials 112 in the third direction, insulation layer 116 on insulating materials 112 and exposed surfaces of pillars 113, and conductive materials 212 to 292 extending in the first direction.

The same structure as a structure on first and second doping regions 311 and 312 may be provided between third and fourth doping regions 313 and 314. Between third and fourth doping regions 313 and 314, exemplarily, there may be provided insulating materials 112 extending in the first direction, pillars 113 sequentially disposed in the first direction and passing through insulating materials 112 in the third direction, insulation layer 116 on insulating materials 112 and the exposed surfaces of pillars 113, and conductive materials 213 to 293 extending in the first direction.

Drains 320 may be provided onto pillars 113, respectively. Exemplarily, drains 320 may be silicon materials that are doped in a second type. For example, drains 320 may be silicon materials that are doped in an n-type. Hereinafter, it is assumed that drains 320 may include n-type silicon. However, drains 320 are not limited thereto. Exemplarily, the width of each of drains 320 may be greater than that of a corresponding pillar 113. For example, each drain 320 may be provided in a pad shape on the upper surface of a corresponding pillar 113.

Conductive materials 331 to 333 extending in the third direction may be provided onto drains 320. Conductive materials 331 to 333 may be sequentially disposed in the first direction. Conductive materials 331 to 333 may be connected to drains 320 of corresponding regions, respectively. Exemplarily, drains 320 and the conductive material extending in the third direction may be connected through contact plugs. Exemplarily, conductive materials 331 to 333 extending in the third direction may be metal materials. Exemplarily, conductive materials 331 to 333 may be conductive materials such as polysilicon.

In FIGS. 15 and 16, each pillar 113 may form a string together with adjacent ones among conductive lines 211 to 291, 212 to 292 and 213 to 293 extending in the first direction. For example, each pillar 113 may form a NAND string NS together with adjacent ones among conductive lines 211 to 291, 212 to 292 and 213 to 293 extending in the first direction. The NAND string NS may include a plurality of transistor structures TS. The transistor structure TS will be described below in more detail with reference to FIG. 17.

Figure 17:
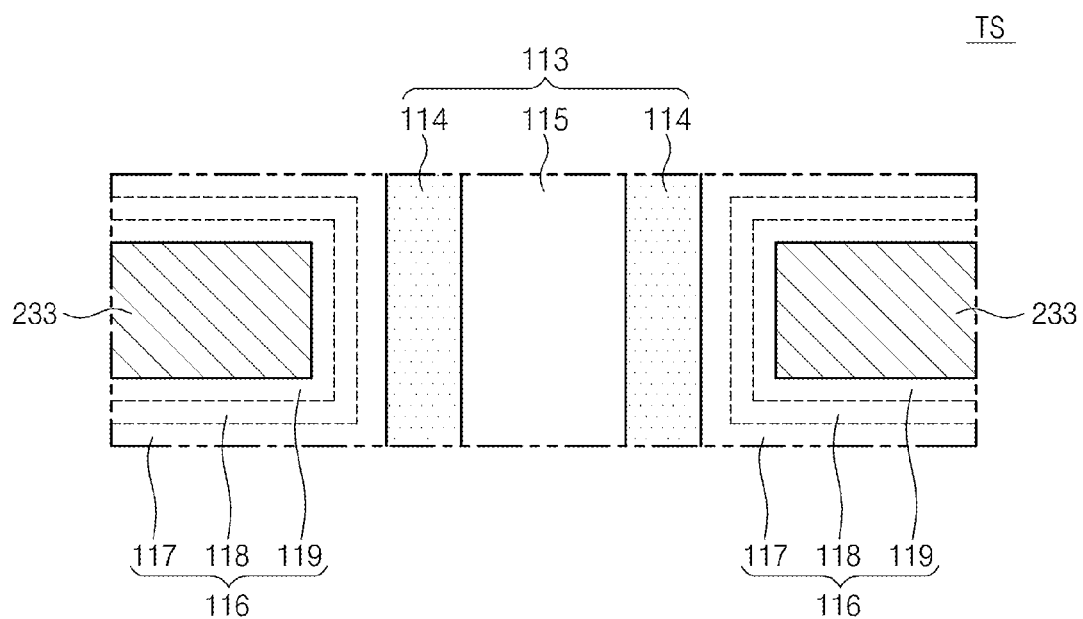
FIG. 17 is a cross section view of a transistor structure TS in FIG. 16.

FIG. 17 is a cross section view of a transistor structure TS in FIG. 16.

Referring to FIGS. 15 to 17, an insulation layer 116 may include first to third sub-insulation layers 117 to 119. For example, first sub-insulation layer 117 adjacent to a pillar 113 may include a thermal oxide layer. For example, second sub-insulation layer 118 may include a nitride layer or metal oxide layer (e.g., an aluminum oxide layer or a hafnium oxide layer). Exemplarily, third sub-insulation layer 119 adjacent to conductive material 233 extending in the first direction may be formed as a single layer or a multi-layer. Third sub-insulation layer 119 may be a high dielectric layer (e.g., an aluminum oxide layer or a hafnium oxide layer) having a higher dielectric constant than first and second sub-insulation layers 117 and 118. Exemplarily, first to third sub-insulation layers 117 to 119 may form an oxide-nitride-oxide (ONO) structure.

Conductive material 233 may serve as a gate (or a control gate). Third sub-insulating layer 119 adjacent to conductive material 233 may serve as a blocking insulation layer. Second sub-insulation layer 118 may serve as a charge storage layer. For example, second sub-insulation layer 118 may serve as a charge trap layer. First sub-insulation layer 117 adjacent to pillar 113 may serve as a tunneling insulation layer, and p-type silicon of pillar 113 may serve as a body. That is, gate (or, control gate) 233, blocking insulation layer 119, charge storage layer 118, tunneling insulation layer 117, and body 114 may form a transistor (or, a memory cell transistor structure). Hereinafter, the p-type silicon of pillar 113 may be referred to as a second-direction body.

A memory block BLKi may include a plurality of pillars 113. That is, the memory block BLKi may include a plurality of NAND strings NS. In more detail, the memory block BLKi may include a plurality of NAND strings NS extending in the second direction (or a direction vertical or perpendicular to the substrate).

Each NAND string NS may include a plurality of transistor structures TS that are arranged in the second direction. At least one of the transistor structures TS of each NAND string NS may serve as a string selection transistor SST. At least one of the transistor structures TS of each NAND string NS may serve as a ground selection transistor GST.

Gates (or control gates) correspond to conductive materials 211 to 291, 212 to 292 and 213 to 293 that extend in the first direction. That is, the gates (or the control gates) may extend in the first direction and form word lines and at least two selection lines (e.g., at least one string selection line SSL and at least one ground selection line GSL). Conductive materials 331 to 333 extending in the third direction each may be connected to one end of a group of the NAND strings NS. Exemplarily, conductive materials 331 to 333 extending in the third direction may serve as bit lines BL. That is, in one memory block BLKi, a plurality of NAND strings may be connected to one bit line BL (e.g., BL1, BL2, BL3, etc.).

Second-type doping regions 311 to 314 extending in the first direction may be provided at the other ends of the NAND strings NS. The second-type doping regions 311 to 314 extending in the first direction may serve as the common source line CSL.

In summary, the memory block BLKi may include a plurality of NAND strings that are extending in a direction (i.e., the second direction) vertical or perpendicular to substrate 111, and serves as a NAND flash memory block (e.g., a charge trapping type) where the plurality of NAND strings NS may be connected to one bit line BL.

FIGS. 15 to 17 were described under the assumption conductive lines 211 to 291, 212 to 292 and 213 to 293 are formed in nine layers. However, the layer number of conductive lines 211 to 291, 212 to 292 and 213 to 293 extending in the first direction is not limited thereto. For example, the conductive lines may be formed in eight layers, sixteen layers, or more layers. That is, one NAND string may include 8, 16, or more transistors.

FIGS. 15 to 17 were described under the assumption that three NAND strings NS are connected to one bit line BL. But, the inventive concept is not limited thereto. Exemplarily, the memory block BLKi may be formed such that m NAND strings NS are connected to one bit line BL. In this case, the number of conductive materials 211 to 291, 212 to 292 and 213 to 293 extending in the first direction and the number of common source lines 311 to 314 may be adjusted in proportion to the number of NAND strings NS connected to one bit line BL.

FIGS. 15 to 17 were described under the assumption that three NAND strings NS are connected to one conductive material extending in the first direction. But, it is well understood that the inventive concept is not limited thereto. For example, n NAND strings NS may be connected to one conductive material. In this case, the number of bit lines may be controlled in proportion to the number of NAND strings NS that are connected to one conductive material extending in the first direction.

Figure 18:
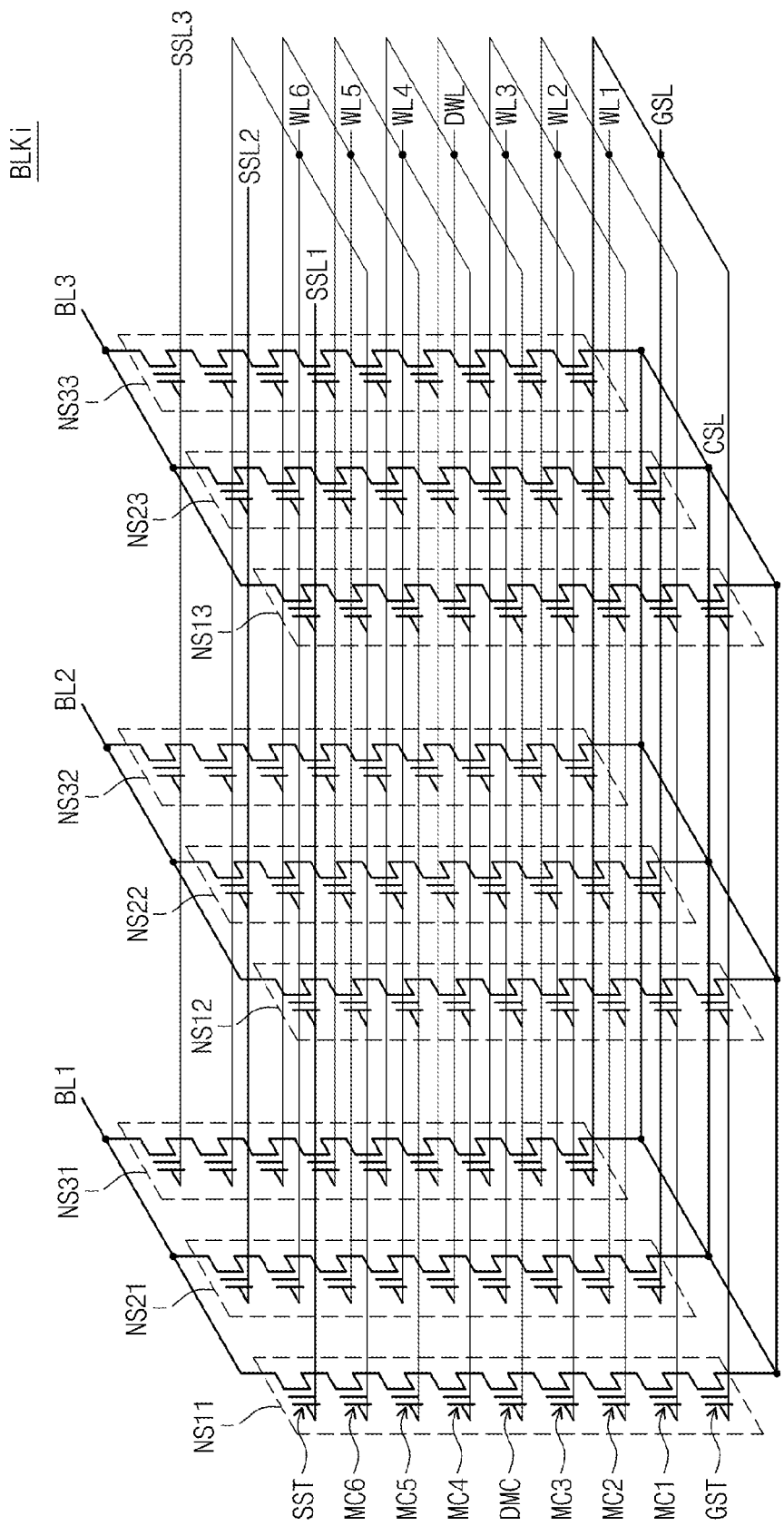
FIG. 18 is an equivalent circuit diagram of a memory block described in FIGS. 15 to 17.

FIG. 18 is an equivalent circuit diagram of a memory block described in FIGS. 15 to 17.

Referring to FIGS. 15 to 18, NAND strings NS11 to NS31 may be provided between the first bit line BL1 and a common source line CSL. The first bit line BL1 may correspond to conductive material 331 extending in the third direction. NAND strings NS11, NS22 and NS32 may be provided between the second bit line BL2 and the common source line CSL. The second bit line BL2 may correspond to conductive material 332 extending in the third direction. NAND strings NS13, NS23 and NS33 may be provided between the third bit line BL3 and the common source line CSL. The third bit line BL3 may correspond to conductive material 333 extending in the third direction.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Hereinafter, NAND strings NS may be defined by the row and by the column. The NAND strings NS connected to one bit line in common may form one column. For example, the NAND strings NS 11 to NS31 connected to the first bit line BL1 may correspond to the first column. The NAND strings NS12 to NS32 connected to the second bit line BL2 may correspond to the second column. The NAND strings NS13 to NS33 connected to the third bit line BL3 may correspond to the third column.

The NAND strings connected to one string selection line SSL may form one row. For example, the NAND strings NS11 to NS13 connected to the first string selection line SSL1 may form the first row. The NAND strings NS21 to NS23 connected to the second string selection line SSL2 may form the second row. The NAND strings NS31 to NS33 connected to the third string selection line SSL3 may form the third row.

In each NAND string NS, a height may be defined. Exemplarily, in each NAND string NS, a memory cell MC1 adjacent to the ground selection transistor GST may be defined to have a height of 1. In each NAND string NS, a height of a memory cell may increase as it becomes close to the string selection transistor SST. In each NAND string NS, a memory cell MC7 adjacent to the string selection transistor SST may be defined to have a height of 7.

The string selection transistors SST of the NAND strings NS in the same row may share the sting selection line SSL. The string selection transistors SST of the NAND strings NS in different rows may be connected with different sting selection lines SSL1, SSL2, and SSL3.

In each NAND string in the same row, memory cells having the same height may share a word line WL. Word lines WL connected with memory cells MC of NAND strings NS placed in different rows and having the same height may be connected in common. In each NAND string in the same row, dummy memory cells DMC having the same height may share a dummy word line DWL. Dummy word lines DWL connected with dummy memory cells DMC of NAND strings NS placed in different rows and having the same height may be connected in common.

In an exemplary embodiment, word lines WL or dummy word lines DWL may be connected in common at a layer where conductive materials 211 to 291, 212 to 292, and 213 to 293 extending in the first direction are provided. For example, conductive materials 211 to 291, 212 to 292, and 213 to 293 extending in the first direction may be connected at an upper layer via contacts. Conductive materials 211 to 291, 212 to 292, and 213 to 293 extending in the first direction may be connected in common at the upper layer.

Ground selection transistors GST of NAND strings NS in the same row may share a ground selection line GSL. Ground selection transistors GST of NAND strings NS in different rows may share a ground selection line GSL. That is, NAND strings NS11 to NS13, NS21 to NS23, and NS31 to NS33 may be connected in common with the ground selection line GSL.

The common source line CSL may be connected to NAND strings NS in common. For example, first to fourth doping regions 311 to 314 may be connected at an active region on substrate 111. In other words, first to fourth doping regions 311 to 314 may be connected to an upper layer via contacts so as to be connected in common at the upper layer.

As illustrated in FIG. 18, the word lines WL having the same depth may be connected in common. Accordingly, when a specific word line WL is selected, all NAND strings NS connected to the specific word line WL may be selected. The NAND strings NS of different rows may be connected to different string selection lines SSL. Therefore, by selecting the string selection lines SSL1 to SSL3, NAND strings NS in an unselected row among NAND strings NS connected to the same word line WL may be separated from bit lines BL1, BL2, and BL3. That is, a row of NAND strings NS may be selected by selecting the string selection lines SSL1 to SSL3. NAND strings in the selected row may be selected by the column by selecting the bit lines BL1 to BL3.

Each NAND string NS may include a dummy memory cell DMC. First to third memory cells MC1 to MC3 may be provided between the dummy memory cell DMC and the ground selection line GSL. Fourth to sixth memory cells MC4 to MC6 may be provided between the dummy memory cell DMC and a string selection line SSL. Memory cells MC in each NAND string may be divided into memory cell groups on the basis of the dummy memory cell DMC. A memory cell group including memory cells (e.g., MC1 to MC3) close to the ground selection transistor GST may be called a lower memory cell group, and a memory cell group including memory cells (e.g., MC4 to MC6) close to the string selection transistor SST may be called an upper memory cell group.

Figure 19:
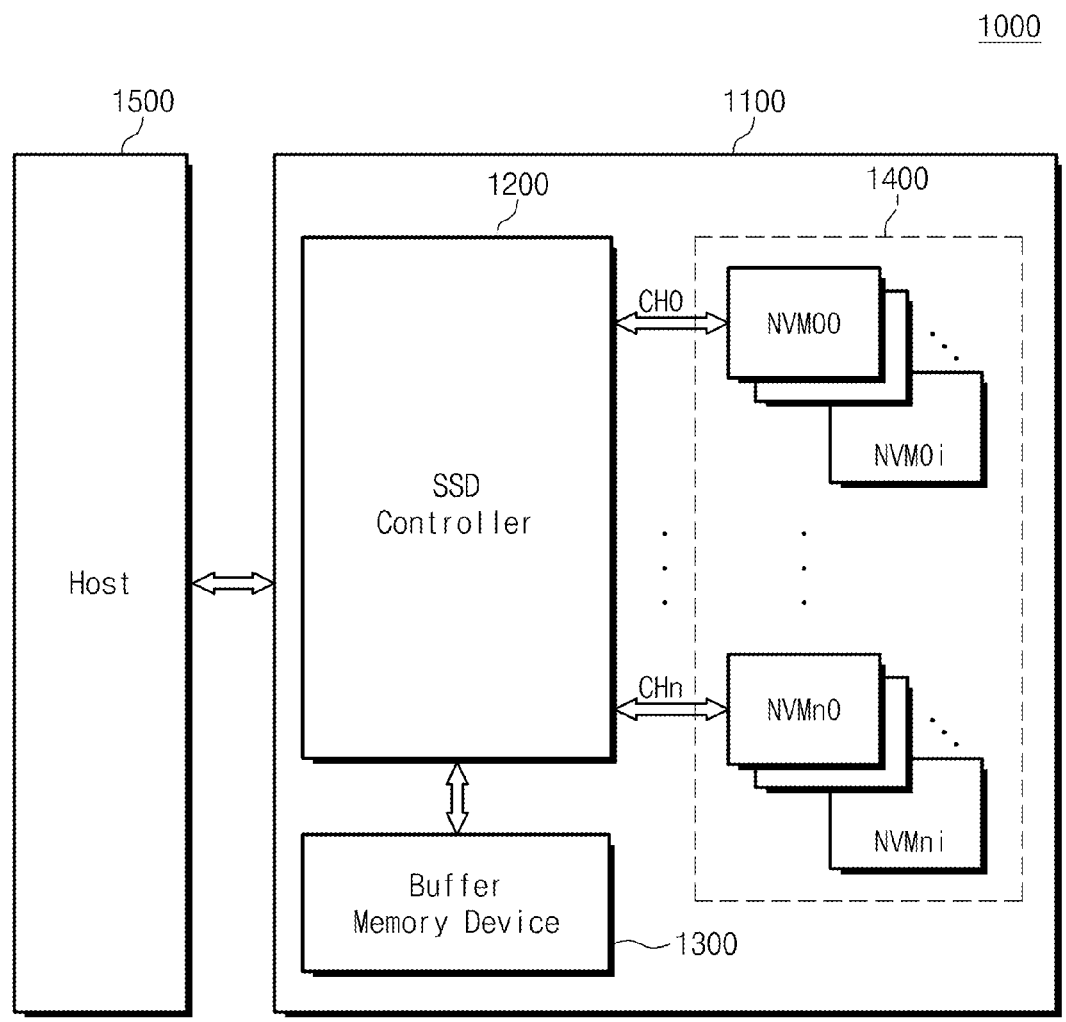
FIG. 19 is a block diagram of a user device including a non-volatile memory device according to exemplary embodiments of the inventive concept.

FIG. 19 is a block diagram of a user device 1000 including a non-volatile memory device according to exemplary embodiments of the inventive concept.

Referring to FIG. 19, user device 1000 may include a data storage device 1100 and a host 1500. Data storage device 1100 may be a solid state drive (hereinafter, referred to as SSD). SSD 1100 may include an SSD controller 1200, a buffer memory device 1300, and a storage media 1400. SSD 1100 may further include an auxiliary power supply having super capacitors. The auxiliary power supply may supply a power to SSD 1100 so as to be ended normally upon sudden power-off.

SSD 1100 may operate in response to an access request of host 1500. That is, SSD controller 1200 may be configured to access storage media 1400 in response to a request from host 1500. For example, SSD controller 1200 may be configured to control read, write, and erase operations of storage media 1400. Buffer memory device 1300 may temporarily store data to be stored in storage media 1400. Further, buffer memory device 1300 may temporarily store data read out from storage media 1400. Data stored in buffer memory device 1300 may be sent to storage media 1400 or host 1500 according to the control of SSD controller 1200.

SSD controller 1200 may be connected with storage media 1400 via a plurality of channels CH0 to CHn. Each channel may be connected with a plurality of non-volatile memory devices. For example, a channel CH0 is connected with a plurality of non-volatile memory devices NVM00 to NVM0i. A plurality of non-volatile memory devices may share a corresponding channel. Storage media 1400 may be formed of a NAND flash memory device according to an exemplary embodiment of the inventive concept. But, it is well understood that storage media 1400 is not limited to a NAND flash memory device. For example, storage media 1400 may be formed of one of non-volatile memory devices such as a NOR flash memory device, a phase-change RAM (PRAM), a ferroelectric RAM (FRAM), a magnetic RAM (MRAM), and the like.

During a read operation, storage media 1400 of data storage device 1100 may perform a coupling compensation read operation. That is, the coupling effect included in a read result of a selected memory cell may be removed on the basis of a program state of a memory cell adjacent to the selected memory cell. For this, a read operation on the adjacent memory cell may be carried out prior to reading data from the selected memory cell. Upon sensing of data from the selected memory cell, one or more read operations may be performed, with one or more read voltages each having a selected voltage level which is selected according to the program state of the adjacent memory cell. As a result, it is possible to improve the reliability of data storage device 1100 by utilizing storage media 1400.

Figure 20:
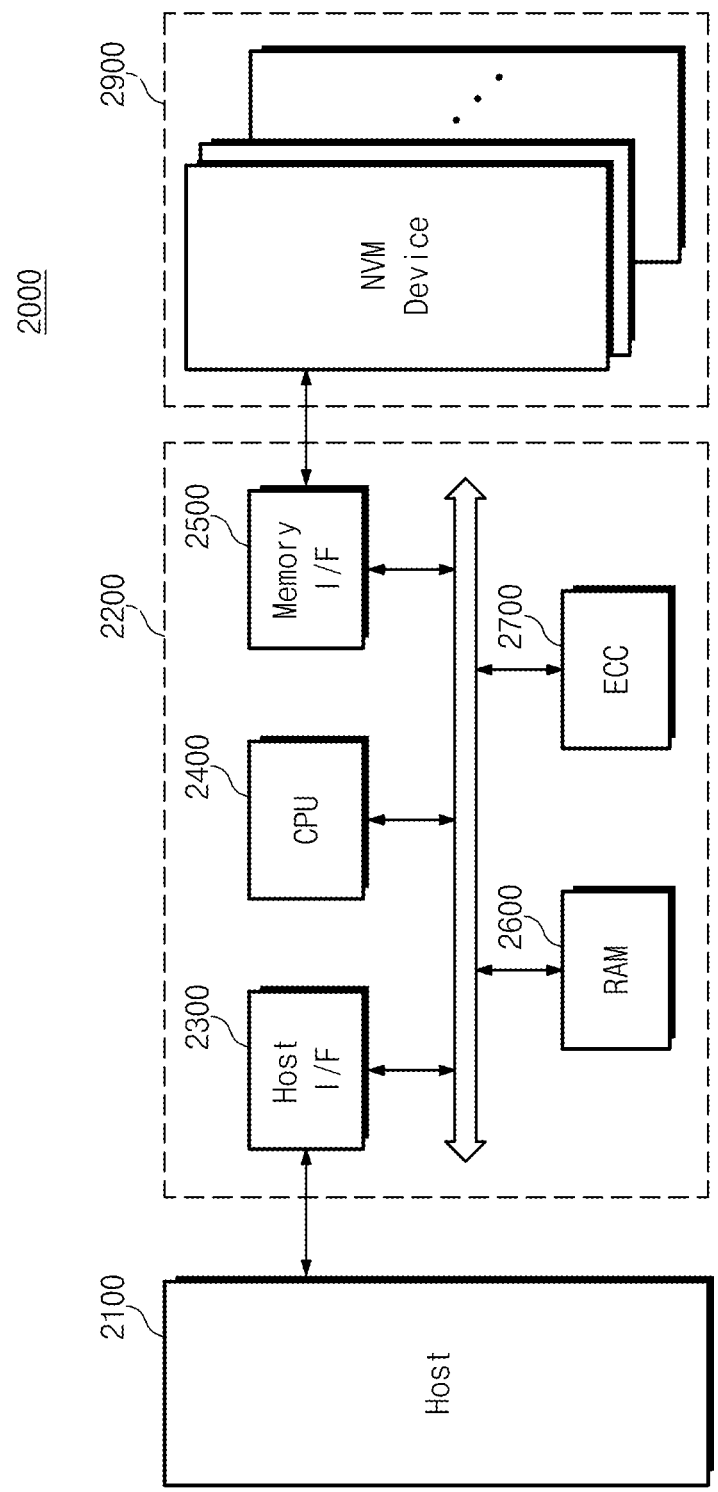
FIG. 20 is a block diagram of another user device including a non-volatile memory device according to exemplary embodiments of the inventive concept.

FIG. 20 is a block diagram of another user device including a non-volatile memory device according to exemplary embodiments of the inventive concept.

Referring to FIG. 20, a memory system 2000 may include a memory controller 2200 and one or more non-volatile memory devices 2900.

Memory controller 2200 may be connected to a host 2100 and non-volatile memory devices 2900. Memory controller 2200 may be configured to access non-volatile memory devices 2900 in response to a request from host 2100. For example, memory controller 2200 may be configured to control read, write, and erase operations of non-volatile memory devices 2900. Memory controller 2200 may be configured to provide an interface between non-volatile memory devices 2900 and host 2100. Memory controller 2200 may be configured to drive firmware for controlling non-volatile memory devices 2900.

Memory controller 2200 may include constituent elements such as a random access memory (RAM) 2600, a central processing unit (CPU) 2400, a host interface 2300, an error check and correction (ECC) block 2700, a memory interface (I/F) 2500, and the like. RAM 2600 may be used as a working memory of CPU 2400. CPU 2400 may control an overall operation of memory controller 2200.

Host interface 2300 may employ one or more protocols for exchanging data between host 2100 and memory controller 2200. For example, memory controller 2200 may be configured to communicate with an external device (e.g., a host) via the various interface protocols such as an USB (Universal Serial Bus) protocol, an MMC (Multimedia Card) protocol, a PCI (Peripheral Component Interconnection) protocol, a PCI-E (PCI-Express) protocol, an ATA (Advanced Technology Attachment) protocol, an SATA (Serial ATA) protocol, an SCSI (Small Computer Small Interface) protocol, an ESDI (Enhanced Small Disk Interface) protocol, an IDE (Integrated Drive Electronics) protocol, and the like.

ECC block 2700 may be configured to detect and correct errors of data read out from non-volatile memory devices 2900. ECC block 2700 may be provided as an element of memory controller 2200. In another embodiment, ECC block 2700 may be provided as an element of each of non-volatile memory devices 2900. Memory interface 2500 may provide an interface between non-volatile memory devices 2900 and memory controller 2200.

It is well understood that constituent elements of memory controller 2200 are not limited to this disclosure. For example, memory controller 2200 may further include a read only memory (ROM) which stores code data needed for initial booting and data for interfacing with host 2100.

Memory controller 2200 and non-volatile memory device 2900 may be integrated in one semiconductor device. Memory controller 2200 and non-volatile memory device 2900 may be configured to form a memory card. Memory controller 2200 and non-volatile memory device 2900 may be configured to form a PCMCIA (personal computer memory card international association) card, a CF (compact flash) card, a SM (smart media) card, memory stick, an MMC (multimedia card) (RS-MMC, MMCmicro, etc.), SD (secure digital) (miniSD, microSD, etc.) card, a UFS (universal flash storage) card, and the like.

In some embodiments, memory controller 2200 and non-volatile memory devices 2900 may be applied to a solid state drive (SSD), a computer, portable computer, an Ultra Mobile PC (UMPC), a workstation, a net-book, a PDA, a web tablet, a wireless phone, a mobile phone, a smart phone, an e-book, a PMP (portable multimedia player), a digital camera, a digital audio recorder/player, a digital picture/video recorder/player, a portable game machine, a navigation system, a black box, a 3-dimensional television, a device capable of transmitting and receiving information at a wireless circumstance, one of various electronic devices constituting home network, one of various electronic devices constituting a computer network, one of various electronic devices constituting a telematics network, a radio frequency identification (RFID) device, or one of various electronic devices constituting a computing system.

In another embodiment, non-volatile memory devices 2900 or memory controller 2200 may be packaged using various types of packages. For example, non-volatile memory devices 2900 or memory system 2000 may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

During a read operation, non-volatile memory device 2900 of memory system 2000 may perform a coupling compensation read operation. That is, the coupling effect included in a read result of a selected memory cell may be compensated on the basis of a program state of a memory cell adjacent to the selected memory cell. For this, a read operation on the adjacent memory cell may be carried out prior to read data from the selected memory cell. Upon sensing of data from the selected memory cell, one or more read operations may be performed according to the program state of the adjacent memory cell, with a read voltage being changed in level when the program state is one that causes coupling to the selected memory cell, from the level that would be employed in the normal or general read operation where the adjacent memory cells do not cause coupling to the selected memory cell. As a result, it is possible to improve the reliability of memory system 2000 by utilizing non-volatile memory devices 2900.

Figure 21:
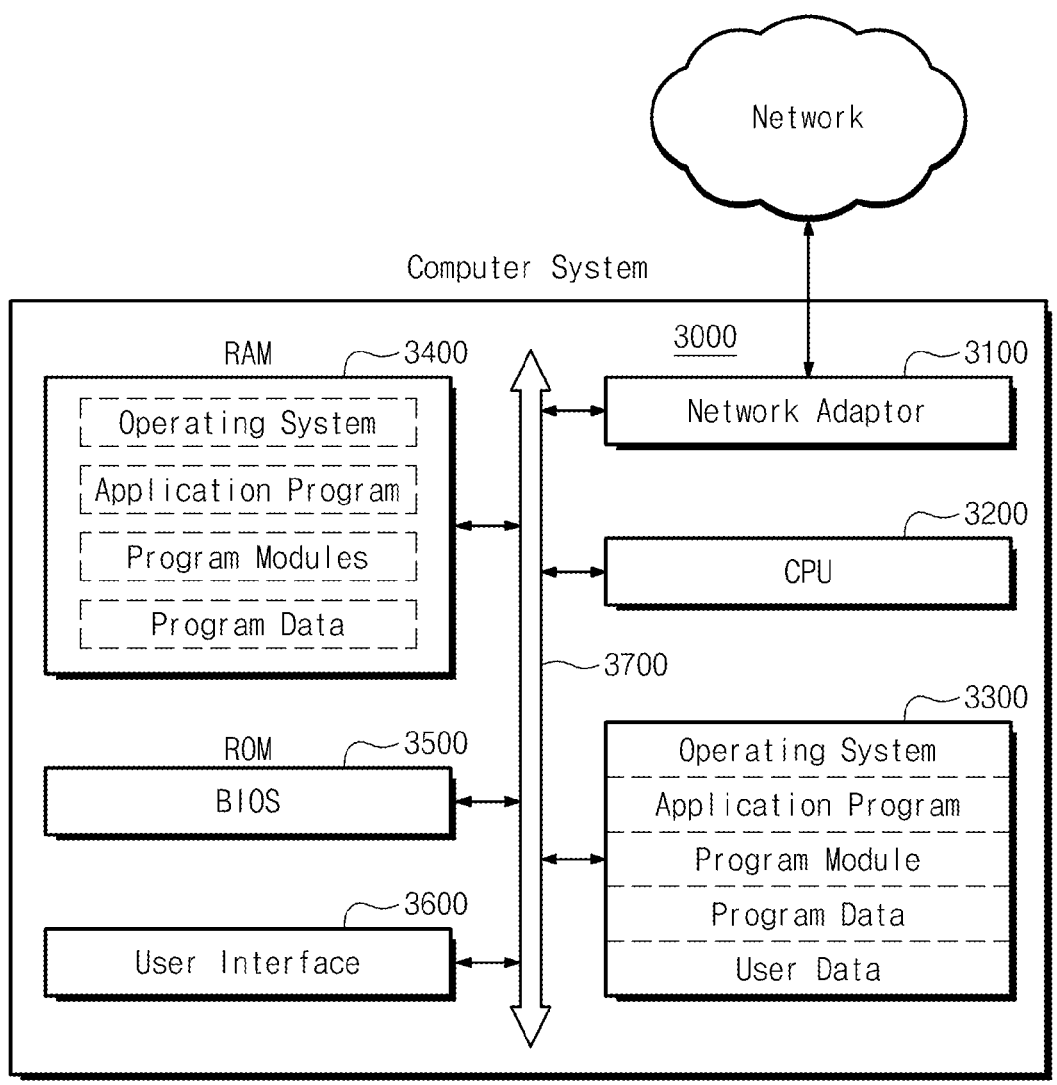
FIG. 21 is a block diagram of a computer system including a data storage device in FIG. 19.

FIG. 21 is a block diagram of a computer system 3000 including a data storage device such as the data storage device illustrated in FIG. 19.

Computer system 3000 may include a network adaptor 3100, a CPU 3200, a data storage device 3300, a RAM 3400, a ROM 3500, and a user interface 3600 which are electrically connected to a system bus 3700.

Network adaptor 3100 may provide an interface between computer system 3000 and external networks. CPU 3200 may control an overall operation for driving an operating system and an application program which are resident in RAM 3400. Data storage device 3300 may store data needed for computer system 3000. For example, data storage device 3300 may store an operating system for driving computer system 3000, an application program, various program modules, program data, user data, and the like.

RAM 3400 may be used as a working memory of computer system 3000. Upon booting, the operating system, the application program, the various program modules, and program data needed to drive programs and various program modules read out from data storage device 3300 may be loaded on RAM 3400. ROM 3500 may store a basic input/output system (BIOS) which is activated before the operating system is driven upon booting. Information exchange between computer system 3000 and a user may be made via user interface 3600, which may include, for example, a display device, a keyboard, a touch screen, and/or a navigation device such as a mouse.

In addition, computer system 3000 may further include a battery, a modem, and the like. Although not shown in FIG. 21, computer system 3000 may further include an application chipset, a camera image processor (CIS), a mobile DRAM, and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of reading data from a selected memory cell of a non-volatile memory device comprising:
   sensing data stored in an adjacent memory cell which is adjacent to the selected memory cell;
   temporarily storing the sensed data of the adjacent memory cell;
   sensing data stored in the selected memory cell at least once, wherein the sensing is based on the temporarily stored data of the adjacent memory cell; and
   temporarily storing the sensed data of the selected memory cell,
   wherein the stored data of the adjacent memory cell is temporarily stored up to a point of time when sensing a second adjacent memory cell which is adjacent to a second selected memory cell from which data is to be read.

2. The method of claim 1, wherein the selected memory cell stores at least two bits of data which are each accessed according to a page address, and
   wherein sensing data stored in the selected memory cell includes sensing a first one of the bits of data of the selected memory cell.

3. The method of claim 2, further comprising:
   sensing a second one of the bits of data of the selected memory cell based on the sensed data of the adjacent memory cell; and
   temporarily storing the sensed second bit of data of the selected memory cell.

4. The method of claim 3, further comprising:
   outputting the sensed first bit of data of the selected memory cell,
   wherein sensing the second bit of data of the selected memory cell and temporarily storing the sensed second data of the selected memory cell are performed before outputting the sensed first data of the selected memory cell.

5. The method of claim 3, wherein the stored second data of the selected memory cell is maintained until a read operation on the second data is requested.

6. The method of claim 1, wherein sensing the data stored in the selected memory cell comprises applying a read voltage to a selected word line at least once.

7. The method of claim 6, wherein the read voltage has a voltage level that is selected from:
   a first voltage level that is determined according to a first threshold voltage distribution of the selected memory cell that occurs when the selected memory cell does not experience coupling of voltage due to the adjacent memory cell; and
   a second voltage level that is determined according to a second threshold voltage distribution of the selected memory cell that occurs when the selected memory cell experiences the coupling of voltage due to the adjacent memory cell.

8. The method of claim 7, wherein the first voltage level is less than the second voltage level.

9. The method of claim 1, wherein sensing the data stored in the adjacent memory cell comprises determining whether a program state of the adjacent memory cell is a program state which imposes a coupling effect upon the selected memory cell.

10. The method of claim 9, wherein temporarily storing the sensed data of the adjacent memory cell comprises storing information indicating whether a program state of the adjacent memory cell is a program state which imposes the coupling effect upon the selected memory cell.

11. The method of claim 1, wherein a reading operation is performed for the non-volatile memory device in a sequential manner corresponding to a sequential increase of a page address.

12. A non-volatile memory device comprising:
   a memory cell array including a selected memory cell connected with a selected word line, and an adjacent memory cell connected to a word line adjacent to the selected word line;
   a data input/output circuit configured to read data of the selected memory cell and the adjacent memory cell and to temporarily store the read data of the selected memory cell and the adjacent memory cell; and
   control logic configured to control the data input/output circuit to perform at least one read operation on the selected memory cell based on the data of the adjacent memory cell temporarily stored in the data input/output circuit,
   wherein the data input/output circuit retains the temporarily stored data of the adjacent memory cell until a read operation of a second selected memory cell is being executed to read the second selected memory cell.

13. The non-volatile memory device of claim 12, wherein the selected memory cell stores at least two bits of data each accessed according to a page address, and
   wherein the control logic controls the data input/output circuit to read first data and second data of the selected memory cell based on the temporarily stored data of the adjacent memory cell, and to temporarily store the read first data and the read second data.

14. The non-volatile memory device of claim 13, wherein the data input/output circuit retains the second data until a read operation for the second data of the selected memory cell is requested.

15. The non-volatile memory device of claim 12, wherein the data input/output circuit temporarily stores data indicating whether a program state of the adjacent memory cell is a program state which causes a coupling effect from the adjacent memory cell to the selected memory cell.

16. A method of reading data from a selected memory cell of a non-volatile memory device having a plurality of memory cells, the method comprising:
   sensing data stored in an adjacent memory cell which is adjacent to the selected memory cell;
   selecting a voltage level for a first read voltage, including selecting a first voltage level when the sensed data of the adjacent memory cell has a first state, and selecting a second voltage level different from the first voltage level when the sensed data of the adjacent memory cell has a second state different from the first state;
   applying the first read voltage having the selected voltage level to the selected memory cell; and reading first data from the selected memory cell in response to the first read voltage having the selected voltage level.

17. The method of claim 16, wherein the first state is a state that does not cause coupling from the adjacent memory cell to the selected memory cell, and wherein the second state is a state that does cause coupling from the adjacent memory cell to the selected memory cell, and wherein the first voltage level is less than the second voltage level.

18. The method of claim 16, further comprising latching data indicating whether the data of the adjacent memory cell has the first state or has the second state, and accessing the latched data to determine whether to select the first voltage level or the second voltage level.

19. The method of claim 16, further comprising:
selecting a voltage level for a second read voltage in response to the sensed data of the adjacent memory cell;
applying the second read voltage to the selected memory cell; and
reading second data from the selected memory cell in response to the second read voltage.

20. The method of claim 16, wherein the adjacent memory cell and the selected memory cell share one of a bit line and a word line.

\* \* \* \* \*